United States Patent
Liu et al.

(10) Patent No.: US 10,707,326 B2
(45) Date of Patent: Jul. 7, 2020

(54) VERTICAL FIELD-EFFECT-TRANSISTORS HAVING A SILICON OXIDE LAYER WITH CONTROLLED THICKNESS

(71) Applicant: International Business Machines Corporation, Armonk, NY (US)

(72) Inventors: Chi-Chun Liu, Altamont, NY (US); Sanjay Mehta, Niskayuna, NY (US); Luciana Meli, Albany, NY (US); Muthumanickam Sankarapandian, Niskayuna, NY (US); Kristin Schmidt, Mountain View, CA (US); Ankit Vora, San Jose, CA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/282,384

(22) Filed: Feb. 22, 2019

(65) Prior Publication Data

US 2019/0189775 A1 Jun. 20, 2019

Related U.S. Application Data

(62) Division of application No. 15/726,525, filed on Oct. 6, 2017, now Pat. No. 10,256,320.

(51) Int. Cl.
*H01L 29/66* (2006.01)
*H01L 21/8238* (2006.01)
(Continued)

(52) U.S. Cl.
CPC .......... *H01L 29/66553* (2013.01); *H01L 21/823814* (2013.01); *H01L 21/823885* (2013.01);
(Continued)

(58) Field of Classification Search
CPC ........... H01L 29/66553; H01L 29/6653; H01L 29/66666; H01L 29/7827; H01L 29/78642; H01L 21/823885
See application file for complete search history.

(56) References Cited

U.S. PATENT DOCUMENTS 6,946,390 B2 9/2005 Schmidt
8,815,747 B2 8/2014 deVilliers et al.
(Continued)

OTHER PUBLICATIONS

Hughes, K., et al., "Nucleation delay in atomic layer deposition on a thin organic layer and the role of reaction thermochemistry", Journal of Vacuum Science & Technology, Jan. 2012, pp. 1-14, vol. 30, No. 1.
(Continued)

*Primary Examiner* — Walter H Swanson
(74) *Attorney, Agent, or Firm* — Fleit Intellectual Property Law; Thomas S. Grzesik

(57) ABSTRACT

A vertical field-effect transistor and a method for fabricating the same. The vertical field-effect transistor includes a substrate and a bottom source/drain region. The vertical field-effect transistor also includes at least one fin structure, and further includes a bottom spacer layer. The bottom spacer layer has a substantially uniform thickness with a thickness variation of less than 3 nm. A gate structure contacts the bottom spacer layer and at least one fin structure. The method includes forming a structure including a substrate, a source/drain region, and one or more fins. A polymer brush spacer is formed in contact with at least sidewalls of the one or more fins. A polymer brush layer is formed in contact with at least the source/drain region and the polymer brush spacer. The polymer brush spacer is removed. Then, the polymer brush layer is reflowed to the sidewalls of the at least one fin.

19 Claims, 18 Drawing Sheets

(51) Int. Cl.
*H01L 29/78* (2006.01)
*H01L 29/08* (2006.01)
*H01L 27/088* (2006.01)
*H01L 29/423* (2006.01)
*H01L 29/786* (2006.01)
*H01L 29/417* (2006.01)

(52) U.S. Cl.
CPC ........ *H01L 27/088* (2013.01); *H01L 29/0847* (2013.01); *H01L 29/41733* (2013.01); *H01L 29/42392* (2013.01); *H01L 29/6653* (2013.01); *H01L 29/66666* (2013.01); *H01L 29/7827* (2013.01); *H01L 29/78642* (2013.01)

(56) References Cited

U.S. PATENT DOCUMENTS

| | | | |
|---|---|---|---|
| 9,184,058 | B2 | 11/2015 | Brown et al. |
| 9,368,572 | B1 * | 6/2016 | Cheng ................. H01L 29/7827 |
| 9,388,268 | B2 | 7/2016 | Gopalan et al. |
| 9,416,447 | B2 | 8/2016 | Arora et al. |
| 9,418,848 | B2 | 8/2016 | Brown et al. |
| 9,431,305 | B1 | 8/2016 | Anderson et al. |
| 9,589,960 | B1 | 3/2017 | Min |
| 2012/0248525 | A1 | 10/2012 | Lee et al. |
| 2015/0024597 | A1 | 1/2015 | Gao et al. |
| 2015/0225850 | A1 | 8/2015 | Arora et al. |
| 2015/0228759 | A1 | 8/2015 | Chen et al. |
| 2016/0211259 | A1 | 7/2016 | Guo et al. |

OTHER PUBLICATIONS

Mansky, P., et al., "Controlling Polymer-Surface Interactions with Random Copolymer Brushes", Science, Mar. 7, 1997, pp. 1458-1460, vol. 275, No. 5305.
Sirard, S., et al., "Interactions between plasma and block copolymers used in directed self-assembly patterning", Proceedings of SPIE Advanced Lithography, Feb. 21-25, 2016, pp. 1-11.
Durand, W., et al., "Design of High-x Block Copolymers for Lithography", Journal of Polymer Science Part A: Polymer Chemistry, Jan. 2015, pp. 1-9, vol. 53, No. 2.
List of IBM Patents or Patent Applications Treated as Related.

* cited by examiner

VERTICAL FIELD-EFFECT-TRANSISTORS HAVING A SILICON OXIDE LAYER WITH CONTROLLED THICKNESS

BACKGROUND OF THE INVENTION

The present disclosure generally relates to the field of semiconductors, and more particularly relates to vertical field-effect-transistors having a silicon oxide layer with controlled thickness.

Fin field-effect transistor (FinFET) devices include a transistor architecture that uses raised source-to-drain channel regions, referred to as fins. A FinFET device can be built on a semiconductor substrate, where a semiconductor material, such as silicon, is patterned into a fin-like shape and functions as the channel of the transistor. Known FinFET devices include fins with source/drain regions on lateral sides of the fins, so that current flows in a horizontal direction (e.g., parallel to a substrate) between source/drain regions at opposite ends of the fins in the horizontal direction. The known structures have their architectures limited by scaling plateaus. For example, known horizontal devices can have contacted poly pitch (CPP) plateaus between 30 nm and 50 nm, and are driven by such competing considerations as electrostatics, contact resistance ($R_{contact}$), and maximum voltage ($V_{max}$).

SUMMARY OF THE INVENTION

In one embodiment, a method for fabricating a semiconductor structure comprising at least one vertical transistor is provided. The method comprises forming a structure including a substrate, a bottom source/drain region, and one or more fins. A polymer brush spacer is formed in contact with at least sidewalls of the one or more semiconductor fins. A polymer brush layer is formed in contact with at least the bottom source/drain region and the polymer brush spacer. The polymer brush spacer is removed. After the polymer brush spacer has been removed, the polymer brush layer is reflowed to the sidewalls of the one or more semiconductor fins. The polymer brush layer forms a bottom spacer layer of the structure.

In another embodiment, a vertical field-effect transistor is provided. The vertical field-effect transistor comprises a substrate, a bottom source/drain region, and at least one fin structure formed in contact with the bottom source/drain layer. The vertical field-effect transistor further comprises a bottom spacer layer having a substantially uniform thickness with a thickness variation of less than 3 nm. The bottom spacer contacts a sidewall of the at least one fin structure. The vertical field-effect transistor also comprises a gate structure in contact with the bottom spacer layer and at least one fin structure.

In yet another embodiment, an integrated circuit is provided. The integrated circuit comprises a vertical field-effect transistor. The vertical field-effect transistor comprises substrate, a bottom source/drain region, and at least one fin structure formed in contact with the bottom source/drain layer. The vertical field-effect transistor further comprises a bottom spacer layer having a substantially uniform thickness with a thickness variation of less than 3 nm. The bottom spacer contacts a sidewall of the at least one fin structure. The vertical field-effect transistor also comprises a gate structure in contact with the bottom spacer layer and at least one fin structure.

BRIEF DESCRIPTION OF THE DRAWINGS

The accompanying figures where like reference numerals refer to identical or functionally similar elements throughout the separate views, and which together with the detailed description below are incorporated in and form part of the specification, serve to further illustrate various embodiments and to explain various principles and advantages all in accordance with the present disclosure, in which.

DETAILED DESCRIPTION

Figure 1:
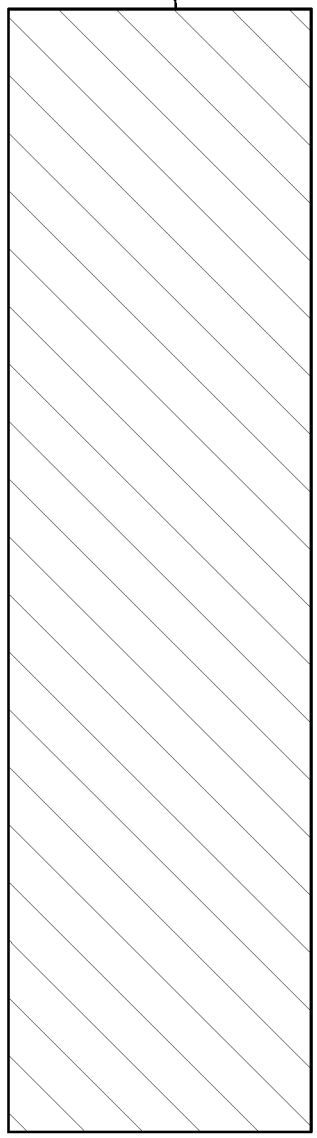
FIG. 1 is a cross-sectional view of an initial semiconductor structure according to one embodiment of the present disclosure.

Various embodiments of the invention will now be discussed in further detail with regard to semiconductor devices and methods of manufacturing same and, in particular, to a fabrication method and structure of a vertical field-effect transistor (FET) including a bottom spacer layer having a uniform thickness.

Embodiments of the present invention relate to vertical transport architecture FET devices including source/drain regions at ends of the fins on top and bottom sides of the fins so that current runs through the fins in a vertical direction (e.g., perpendicular to a substrate) from a bottom source/drain region to a top source/drain region. Vertical transport architecture devices are designed to extend the product value proposition beyond conventional plateaus and address the limitations of horizontal device architectures by, for example, decoupling electrostatics and FET ($V_{max}$) from CPP, providing a FinFET-equivalent density at a larger CPP, by removing the Lgate as a pressure point.

Vertical FETs typically require formation of bottom/junction(s) and spacer(s) in separate fabrication steps. Formation of the bottom spacer generally requires directional deposition of spacer film at the bottom of the device structure with minimal to no sidewall coverage. The thickness of the spacer film defines the gate length of the device, which is critical to device performance. In many instances, conventional techniques for forming the bottom spacer do not completely eliminate deposition of the spacer material on sidewalls of the fin, and/or suffer from variability (iso-to-dense, pitch variability) of bottom step coverage. For example, thickness of the bottom spacer at the fin region and open region can vary by more than 3 nm. In addition, pitch walk can introduce additional spacer thickness variability within the dense array of fins. Embodiments of the present invention overcome problems with sidewall deposition and variability in the thickness of the bottom spacer by implementing a polymer brush system to form the bottom spacer. The coverage and thickness of the spacer material is controlled by grafting density and molecular weight of the brush material. Accordingly, embodiments of the present invention form a bottom spacer for a vertical FET having a substantially uniform thickness with a thickness variation of less than 3 nm.

It is to be understood that the various layers and/or regions shown in the accompanying drawings are not drawn to scale, and that one or more layers and/or regions of a type commonly used in complementary metal-oxide semiconductor (CMOS), fin field-effect transistor (FinFET), metal-oxide-semiconductor field-effect transistor (MOSFET) and/or other semiconductor devices may not be explicitly shown in a given drawing. This does not imply that the layers and/or regions not explicitly shown are omitted from the actual devices. In addition, certain elements may be left out of particular views for the sake of clarity and/or simplicity when explanations are not necessarily focused on the omitted elements. Moreover, the same or similar reference numbers used throughout the drawings are used to denote the same or similar features, elements, or structures, and thus, a detailed explanation of the same or similar features, elements, or structures will not be repeated for each of the drawings.

The semiconductor devices and methods for forming same in accordance with embodiments of the present invention can be employed in applications, hardware, and/or electronic systems. Suitable hardware and systems for implementing embodiments of the invention may include, but are not limited to, personal computers, communication networks, electronic commerce systems, portable communications devices (e.g., cell and smart phones), solid-state media storage devices, functional circuitry, etc. Systems and hardware incorporating the semiconductor devices are contemplated embodiments of the invention. Given the teachings of embodiments of the invention provided herein, one of ordinary skill in the art will be able to contemplate other implementations and applications of embodiments of the invention.

The embodiments of the present invention can be used in connection with semiconductor devices that may require CMOSs, MOSFETs and/or FinFETs. By way of non-limiting example, the semiconductor devices can include, but are not limited to CMOS, MOSFET and FinFET devices, and/or semiconductor devices that use CMOS, MOSFET and/or FinFET technology.

As used herein, "vertical" refers to a direction perpendicular to a substrate in the cross-sectional and three-dimensional views herein. Current between source/drain regions is described herein as flowing in a vertical direction (e.g., from a bottom source/drain region to a top source/drain region) through a fin channel region.

As used herein, "horizontal" refers to a direction parallel to a substrate in the cross-sectional and three-dimensional views herein.

As used herein, "thickness" refers to a size of an element (e.g., a layer, trench, hole, etc.) in the cross-sectional views measured from a bottom surface to a top surface, or a left side surface to a right side surface of the element, and/or measured with respect to a surface on which the element is directly on.

Unless otherwise specified, as used herein, "height" or "height above a substrate" refers to a vertical size of an element (e.g., a layer, trench, hole, etc.) in the cross-sectional views measured from a top surface of the substrate 102 to a top surface of the element. A thickness of an element can be equal to a height of the element if the element is directly on the substrate.

As used herein, "lateral," "lateral side," "lateral surface" refers to a side surface of an element (e.g., a layer, opening, etc.), such as a left or right side surface in the cross-sectional views herein.

Figure 2:
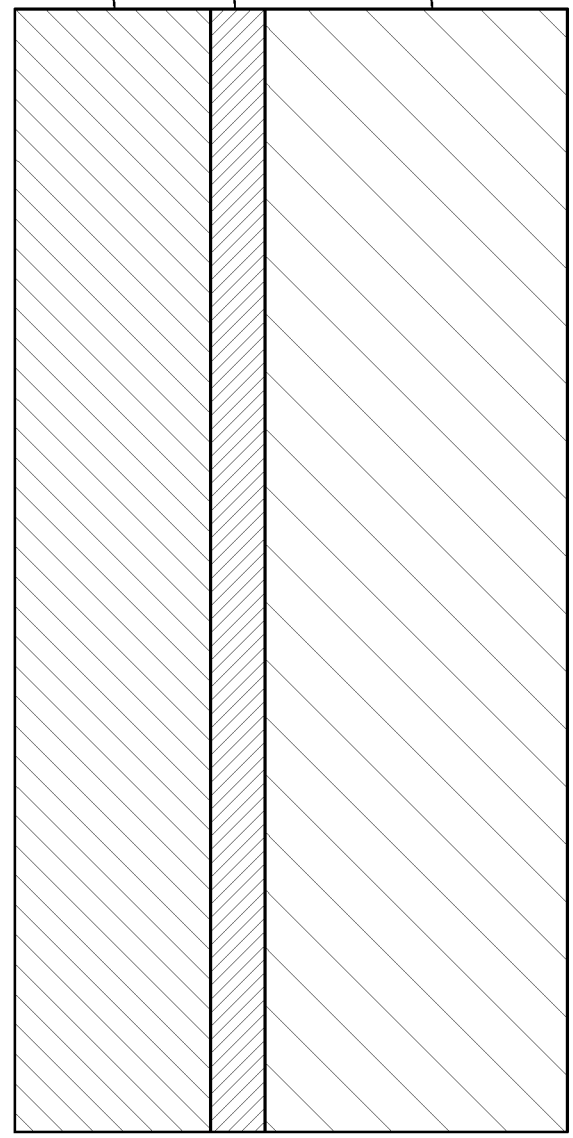
FIG. 2 is a cross-sectional view of an alternative initial semiconductor structure according to one embodiment of the present disclosure.

Referring to FIG. 1, a semiconductor substrate 102 is shown. The substrate 102 may be, for example, a bulk substrate including semiconductor material including, but not limited to, silicon (Si), silicon germanium (SiGe), strain-relaxed buffer (SRB) SiGe, silicon carbide (SiC), silicon-germanium-carbon (SiGeC) or other like semiconductor. In addition, multiple layers of the semiconductor materials can be used as the semiconductor material of the substrate. In some embodiments, an n+ or p+ doped semiconductor layer 202 of and/or a non-doped semiconductor layer 204 may be epitaxially grown on the substrate 102, as shown in FIG. 2. The doped semiconductor layer 202 may include, but is not limited to, Si, SiGe or SiC. The non-doped semiconductor layer 204 may include, but is not limited to, Si, SiGe or III-V materials.

Doping of the semiconductor layer 204 may be performed using, for example, ion implantation, or annealing if not using an epitaxial process. In a non-limiting illustrative example, the doping of the layer 204 uses, for example, arsenic (As) or phosphorous (P) for n-type device (e.g., nFET), and boron (B) for a p-type device (e.g., pFET), at concentrations in the general range of, for example, e20/ cm$^3$.

Terms such as "epitaxial growth" and "epitaxially formed and/or grown" refer to the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. For example, an epitaxial semiconductor material deposited on a {100} crystal surface will take on a {100} orientation.

Examples of various epitaxial growth processes include, for example, rapid thermal chemical vapor deposition (RTCVD), low-energy plasma deposition (LEPD), ultra-high vacuum chemical vapor deposition (UHVCVD), atmospheric pressure chemical vapor deposition (APCVD), liquid-phase epitaxy (LPE), molecular beam epitaxy (MBE) and metal-organic chemical vapor deposition (MOCVD). The temperature for an epitaxial growth process can range from, for example, 550° C. to 900° C., but is not necessarily limited thereto, and may be conducted at higher or lower temperatures as needed.

A number of different sources may be used for the epitaxial growth. For example, the sources may include precursor gas or gas mixture including for example, a silicon containing precursor gas (such as silane) and/or a germanium containing precursor gas (such as a germane). Carrier gases like hydrogen, nitrogen, helium and argon can be used.

Figure 3:
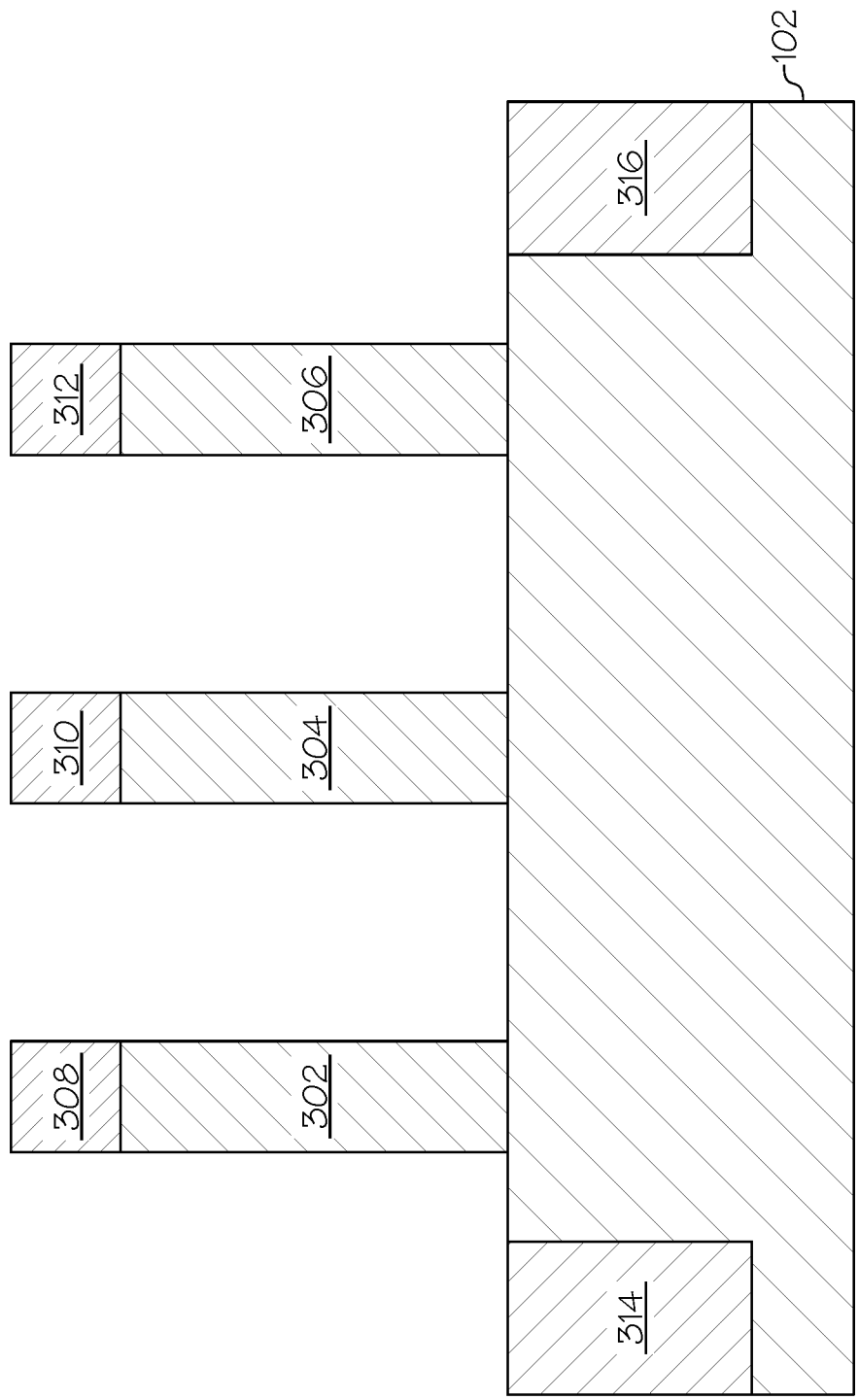
FIG. 3 is a cross-sectional view of the semiconductor structure after fin structures have been formed according to one embodiment of the present disclosure.

FIG. 3 shows that fins 302, 304, 306 may be formed by patterning the substrate of FIG. 1. Alternatively, in an embodiment where semiconductor layer 204 was formed/grown on the substrate 102 (as shown in FIG. 2), the fins 302, 304, 306 may be formed by patterning the semiconductor layer 204. A hardmask 308, 310, 312 including, for example, a dielectric material, such as silicon nitride (SiN) is formed on portions that are to be formed into the fins 302, 304, 306. The fin patterning may be performed by a spacer image transfer (SIT) process, for example. The SIT process includes using lithography to form a pattern referred to as a mandrel. The mandrel material may include, but is not limited to, amorphous silicon or amorphous carbon. After the mandrel formation, a conformal film may be deposited and then followed by an etchback. The conformal film may form spacers at both sides of the mandrel. The spacer material may include, but is not limited, oxide or SiN. The mandrel may then be removed by reactive ion etching (ME) processes. As a result, the spacers will have half the pitch of the mandrel. In other words, the pattern is transferred from a lithography defined mandrel to spacers, where the pattern density is doubled. The spacer pattern may be used as the hardmask 308, 310, 312 to form the fins 302, 304, 306 by RIE processes. According to one embodiment, the fins may be patterned to height of about 20 nm to about 50 nm. However, other heights are applicable as well. After the fins 302, 304, 306 have been formed the hardmasks 308, 310, 312 may be removed.

Figure 18:
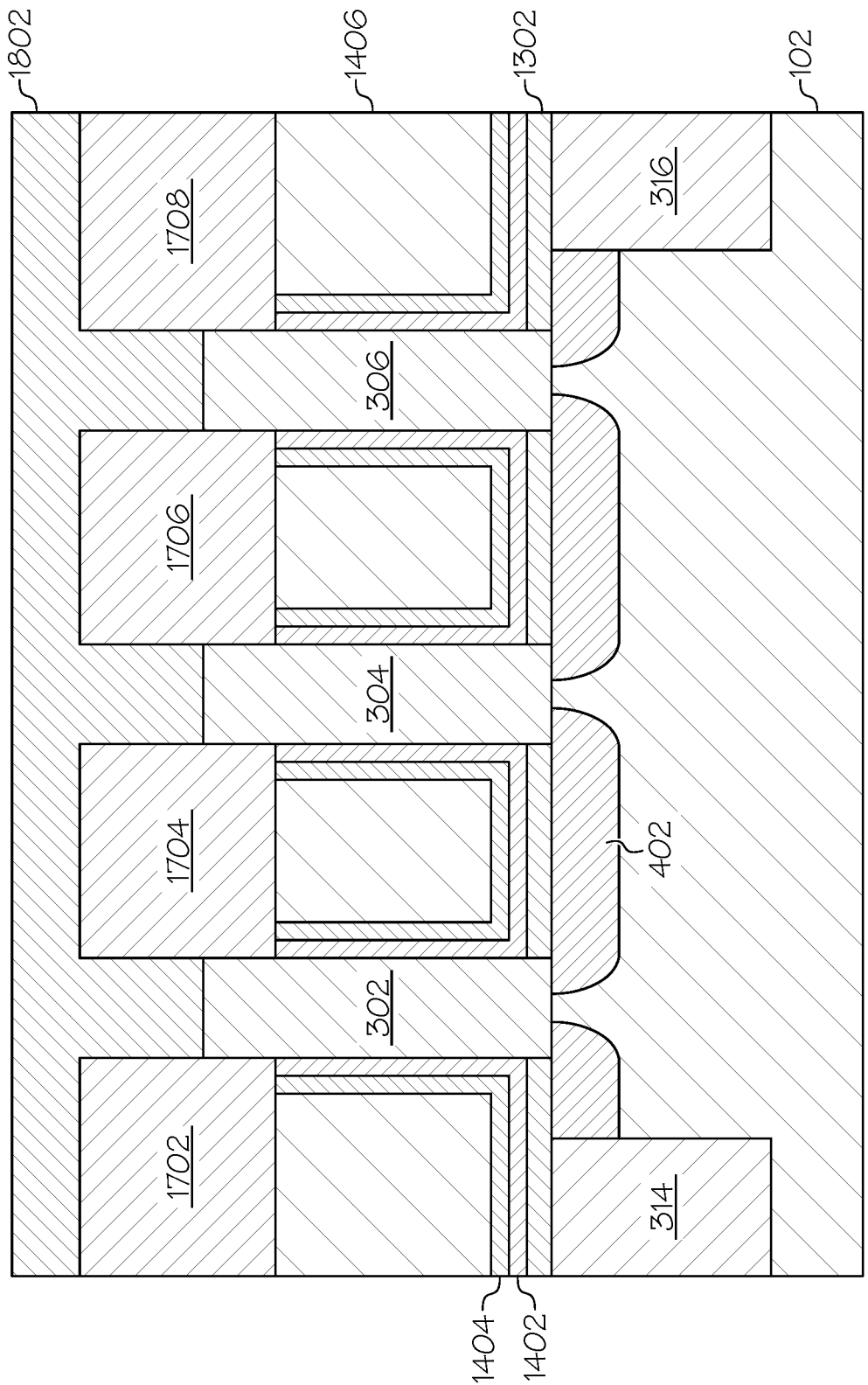
FIG. 18 is a cross-sectional view of the semiconductor structure after a top source/drain layer has been formed according to one embodiment of the present disclosure.

FIG. 3 also illustrates formation of isolation regions 314, 316. Portions of the substrate 102 (and doped semiconductor layer 202 if formed) is etched to form trenches therein, in which a dielectric material, including, but not limited to silicon dioxide (SiO$_2$), low-temperature oxide (LTO), high-temperature oxide (HTO), flowable oxide (FOX) or some other dielectric, is deposited to form isolation regions 314, 316, such as, for example, shallow trench isolation (STI) regions. The dielectric material can be deposited using deposition techniques including, but not limited to, chemical vapor deposition (CVD), plasma enhanced CVD (PECVD), radio-frequency CVD (RFCVD), physical vapor deposition (PVD), atomic layer deposition (ALD), molecular layer deposition (MLD), molecular beam deposition (MBD), pulsed laser deposition (PLD), and/or liquid source misted chemical deposition (LSMCD), sputtering, and/or plating, followed by a planarization process, such as, chemical mechanical planarization (CMP) to remove excess isolation material. It should be noted that the height of the isolation regions 314, 316 may be such that a top surface of these regions 314, 316 are co-planar with a top surface of a top source/drain layer 1802 (FIG. 18).

Figure 4:
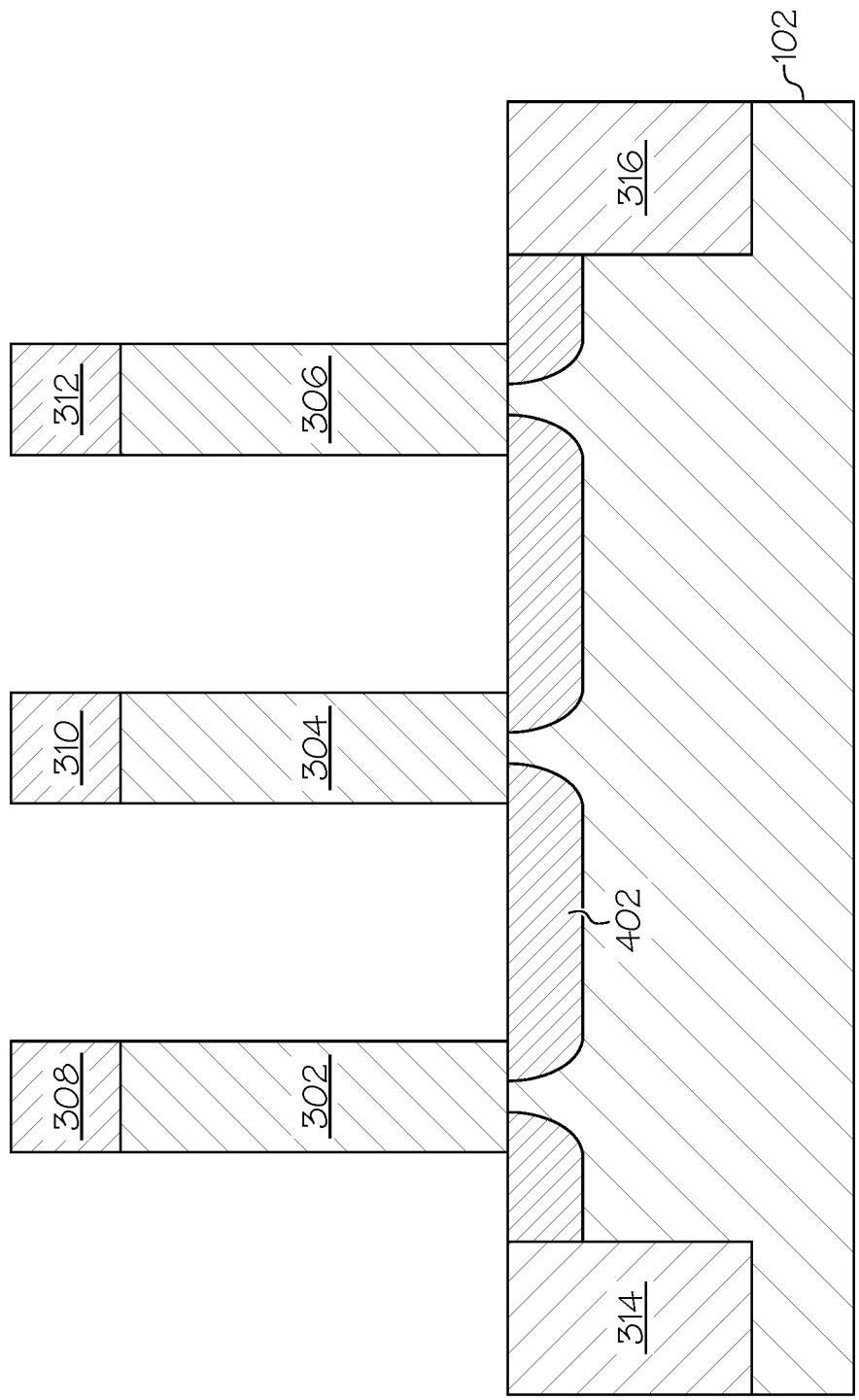
FIG. 4 is a cross-sectional view of the semiconductor structure after a bottom source/drain layer has been formed according to one embodiment of the present disclosure.

After the fins 302, 304, 306 have been formed, a bottom source/drain layer 402 is formed, as shown in FIG. 4. In one embodiment, the bottom source/drain layer 402 is formed by a tilted implantation processes, which reduces the resistance under the fins 302, 304, 306. In other embodiments, a different processes such as dopant drive-in, epitaxial growth, and/or the like is performed to form the a bottom source/drain layer 402. In addition, although FIG. 4 shows the a bottom source/drain layer 402 as being formed within the substrate 102, the bottom source/drain layer 402 may be formed on top and in contact with the substrate layer 102 and/or with a top surface of the a bottom source/drain layer 402. In another embodiment, the n+ or p+ doped semiconductor layer 202 is the bottom source/drain layer 402.

After fabrication of the fins 302, 304, 306 and bottom source/drain 402, a bottom spacer layer comprising a substantially uniform thickness (e.g., thickness variation of less than 3 nm) is formed. In one embodiment, the bottom spacer layer is formed utilizing a polymer brush system. A polymer brush is typically comprised of a homopolymer or random copolymer of two (A and B) or more components plus a functional group (C) at one end. Component A and component B may be used for surface energy control and end group C is for surface binding. More functional groups may be added onto the side chain for additional requirements when needed. One benefit of utilizing the polymer brush system is self-limiting grafting. Only one mono-layer of polymer will be grafted onto the surface because there is only one grafting group per chain. Process temperature, grafting density, kinetics, and surface selectivity may be optimized by choosing a proper grafting group. In addition, side groups may be used to control surface properties, etch behavior, n/k value, etc.

Figure 5:
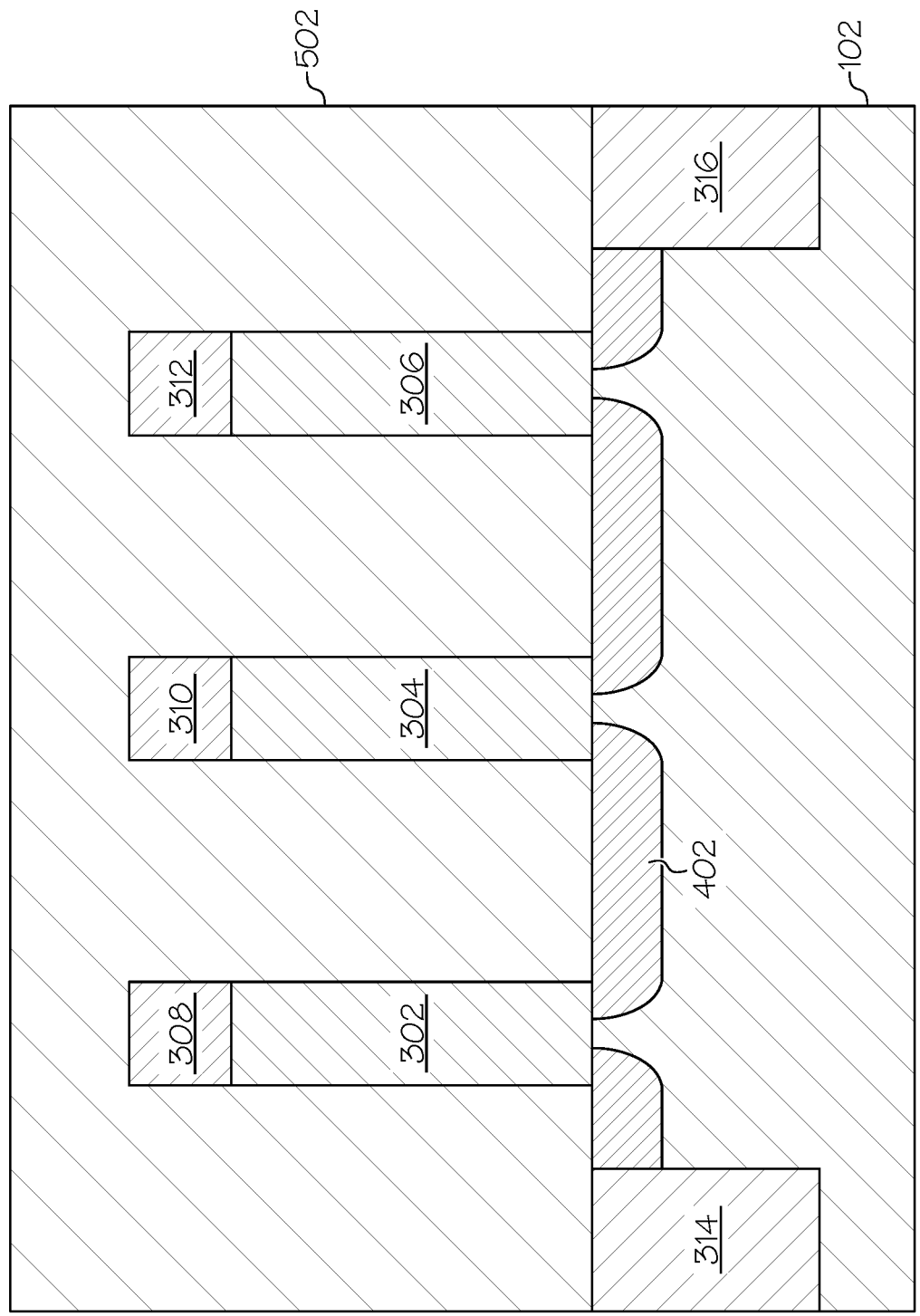
FIG. 5 is a cross-sectional view of the semiconductor structure after a first polymer brush layer has been formed according to one embodiment of the present disclosure.

FIGS. 5 to 13 show illustrates a process for forming the bottom spacer layer utilizing a polymer brush system. In FIG. 5, a polymer brush layer 502 is formed in contact with a top surface of the bottom source/drain layer 402; sidewalls and a top surface of each fin 302, 304, 306 (or hardmask 308, 310, 312 if remaining); and a top surface of the isolation regions 314, 316. In one embodiment, the polymer brush layer 502 comprises polystyrene with an OH group at the end. The polymer brush may be applied to the substrate by spin coating, or other suitable techniques including but not limited to coating, spraying, dip coating, etc. The coating process should allow complete coverage of the targeted surface and result in a film thickness greater than the target grafted thickness. A baking or anneal process is then performed to graft a portion of the polymer brush layer 502 at the respective interfaces between the polymer brush layer 502 and the bottom source/drain layer 402 (or non-doped semiconductor layer 204 if formed); fins 302, 304, 306; and isolation regions 314, 316. The annealing process may be carried out in air, vacuum, or inert atmospheres at a temperature from about 28 C to about 350 C for approximately 1 to 5 min. The temperature depends on the molecular weight and chemistry of the polymer used. The maximum temperature may also be limited by the activation temperature of cross-linking group present in the brush. In other embodiments, the brush comprises a low temperature grating group such as (but not limited to) amine, which can graft at room temperature (e.g., 20° C. to 27° C.). In this embodiment, the baking or anneal process is not required.

Figure 6:
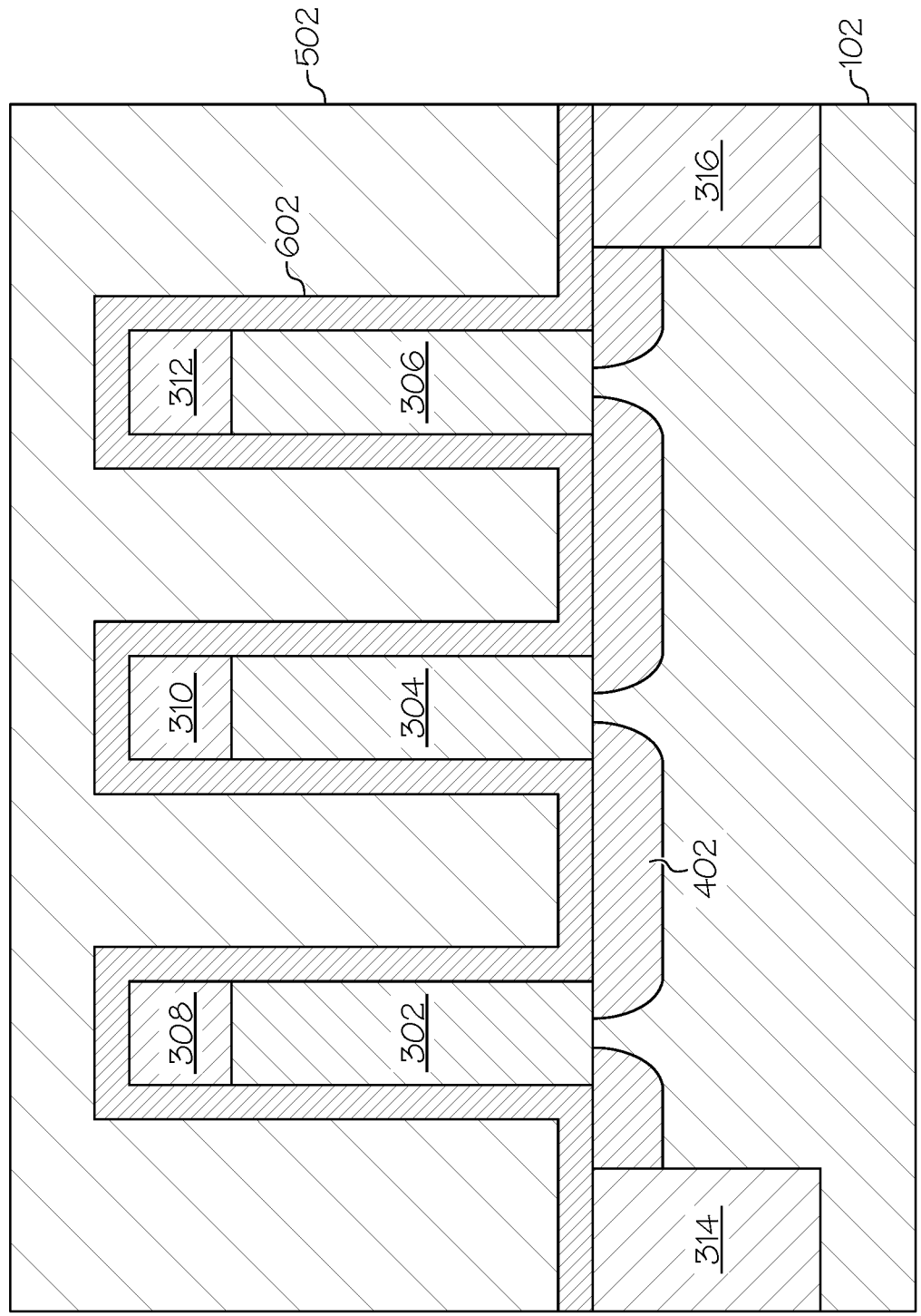
FIG. 6 is a cross-sectional view of the semiconductor structure after grafting process has been performed to form a monolayer from the first polymer brush layer according to one embodiment of the present disclosure.

The grafting process forms a monolayer 602 of the polymer brush 502 as shown in FIG. 6. In one embodiment, the monolayer 602 has a thickness of 2 nm to 10 nm. The thickness of the monolayer 602 is controlled by the chemistry, molecular weight, and grafting density of the polymer brush. In some embodiments, the brush layer may be comprised of hydroxyl terminated polystyrene with molecular weight ranges from about 3,000 g/mol to about 50,000 g/mol. For a polystyrene polymer with molecular weight of approximately 10,000 g/mol, the thickness of the brush will be approximately 5 nm at saturated grafting density.

Figure 7:
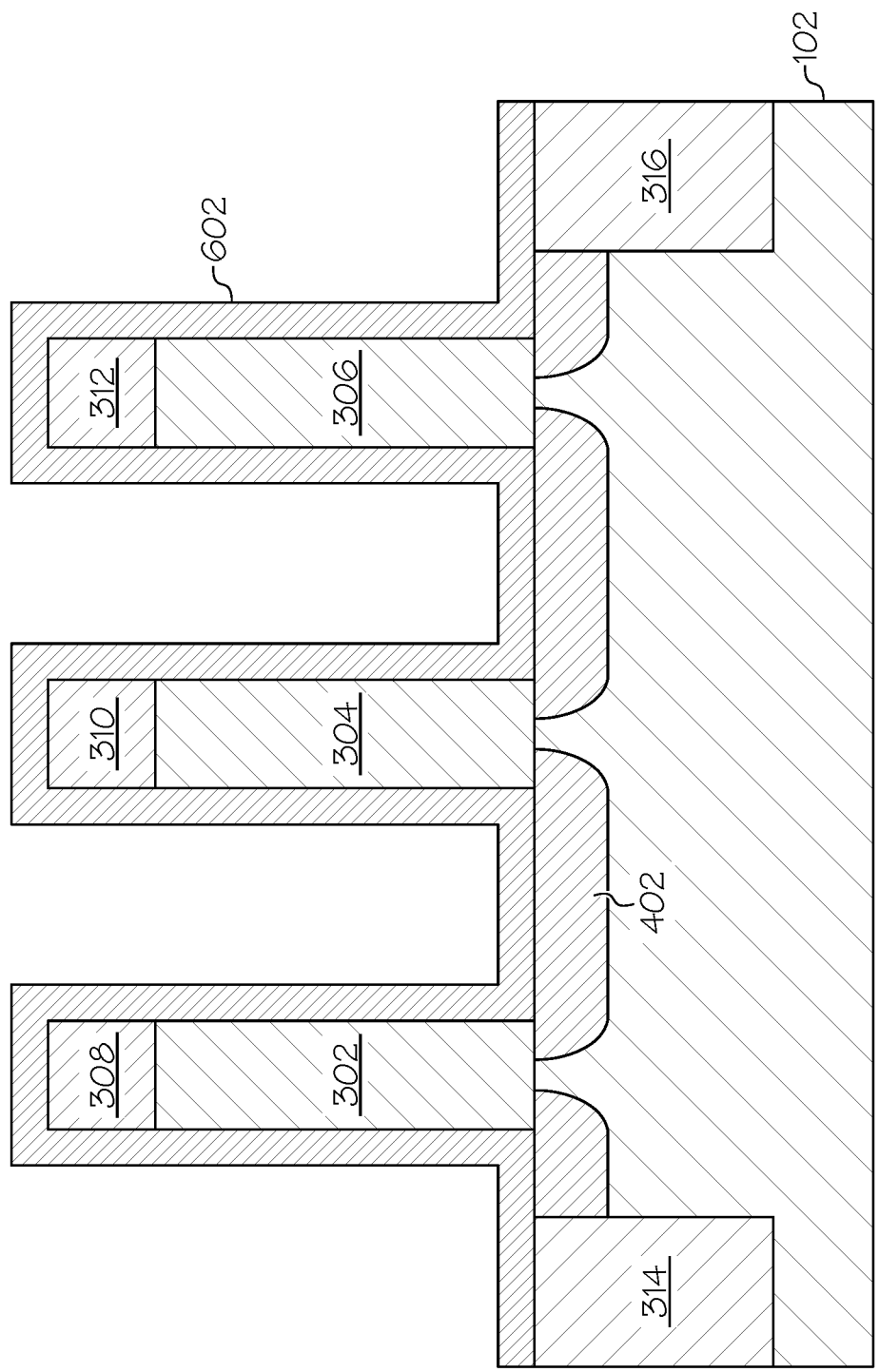
FIG. 7 is a cross-sectional view of the semiconductor structure after unreacted portions of the first polymer brush layer have been removed according to one embodiment of the present disclosure.

The remaining brush layer 502 is given a solvent rinse to remove any excess polymer brush layer 502 that was not cross-linked or grafted to a surface, as shown in FIG. 7. Examples of solvents for dissolving the brush layer 502 alone or in a composition with other components include (but are not limited to) propylene glycol monomethyl ether acetate (PGMEA), ethoxyethyl propionate, anisole, ethyl lactate, 2-heptanone, cyclohexanone, amyl acetate, n-butyl acetate, n-amyl ketone (MAK), gamma-butyrolactone (GBL), toluene, and the like. FIG. 7 shows only the monolayer 602 of the brush material remains after the rinse.

Figure 8:
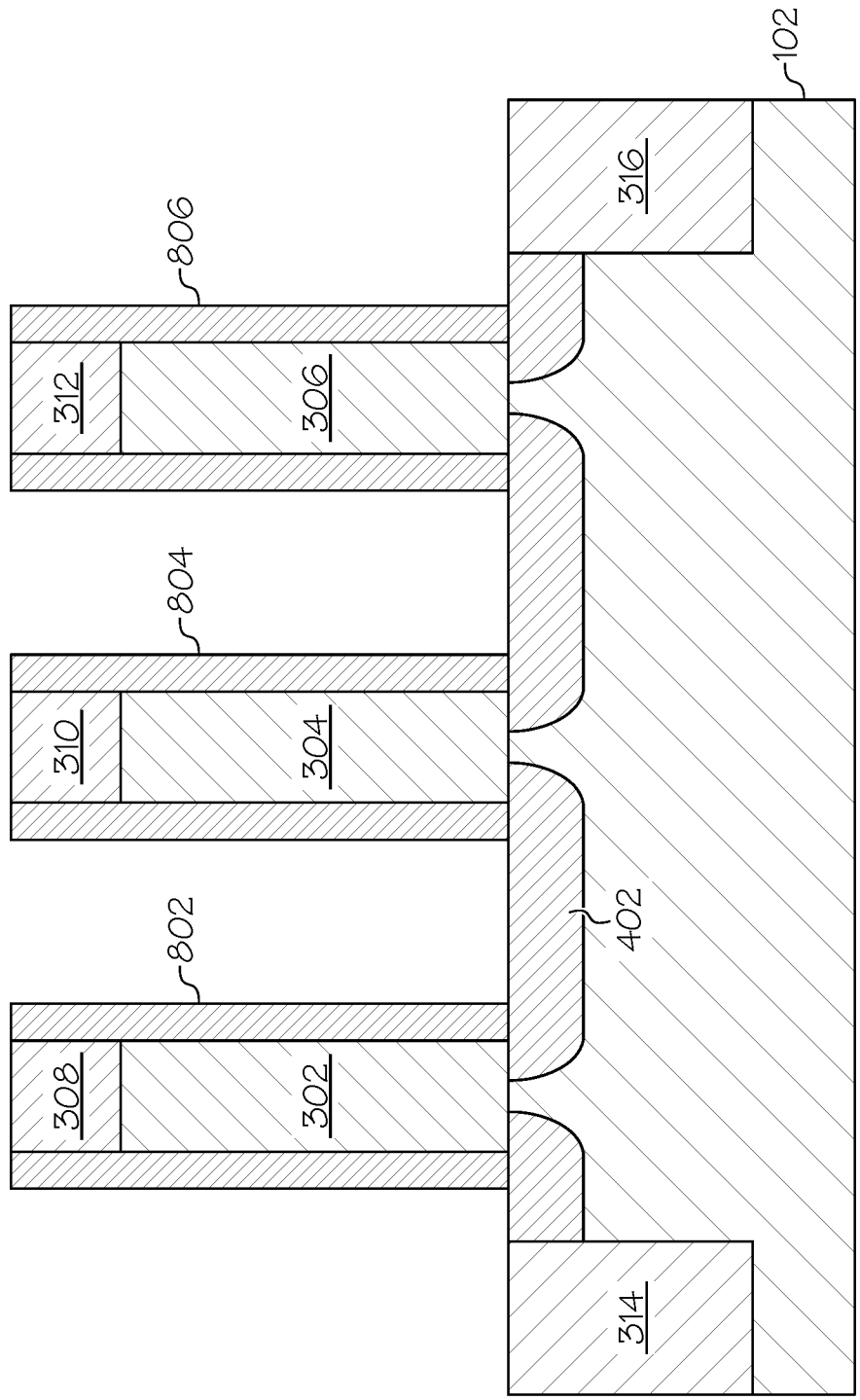
FIG. 8 is a cross-sectional view of the semiconductor structure after the polymer brush monolayer has been removed from horizontal surfaces of the structure to form a polymer brush spacer according to one embodiment of the present disclosure.

FIG. 8 shows that an anisotropic etch (e.g., reactive ion etch (RIE)) is performed to remove portions of the monolayer 602 on horizontal areas of the structure. For example, FIG. 8 shows the portions of the monolayer 602 have been removed from the top surfaces of the bottom source/drain layer 402 and the fins 302, 304, 306 (or hardmasks 308, 310, 312 if remaining). FIG. 8 further shows that a portion 802, 804, 806 of the monolayer 602 remains on the sidewalls of the fins 302, 304, 306. The remaining monolayer is herein referred to as spacer brushes 802, 804, 806.

One or more processes are then performed to cross-link each spacer brush 802, 804, 806. In one embodiment, the polymer brush (and hence the spacer brushes 802, 804, 806) comprises thermally-activated cross-linkable groups. These cross-linkable groups may be incorporated into the grafting polymer to form a network that makes the spacer brush 808 robust for further processing. In some embodiments, the polymer brush (and hence the spacer brushes 802, 804, 806) comprises a high-temperature cross-linking group such as (but not limited to) benzocyclobutene (BCB) with crosslinking temperature of approximately 200° C. or above. The high-temperature characteristic of the cross-linking group prevents activation of the cross-linker during the grafting process. In an embodiment where the spacer brushes 802, 804, 806 comprise thermally-activated cross-linkable groups, a thermal anneal may be performed at an elevated temperature such as 200° C. to 400° C. for a duration of 30 seconds to 5 minutes to promote cross-linking. It should be noted that other temperature and time ranges are applicable as well. In another embodiment, the cross-linkable group(s) is deep ultraviolet (DUV) activated and comprises one or more of a variety of DUV activated cross-linkable groups such as (but not limited to) epoxy, acrylate, and azide groups. In yet another embodiment, styrene group on the polymer main chain may also be used as a crosslinker if a proper wavelength of DUV is chosen. The polymer brush having DUV-activated crosslinkable groups is exposed to DUV radiations of wavelengths from 150 nm to 300 nm for a length of time that is dependent on the dose used. For example, the brush could be crosslinked for 1 to 2 min with a 250 mJ/cm2 dose of radiation with a wavelength of 172 nm.

Figure 9:
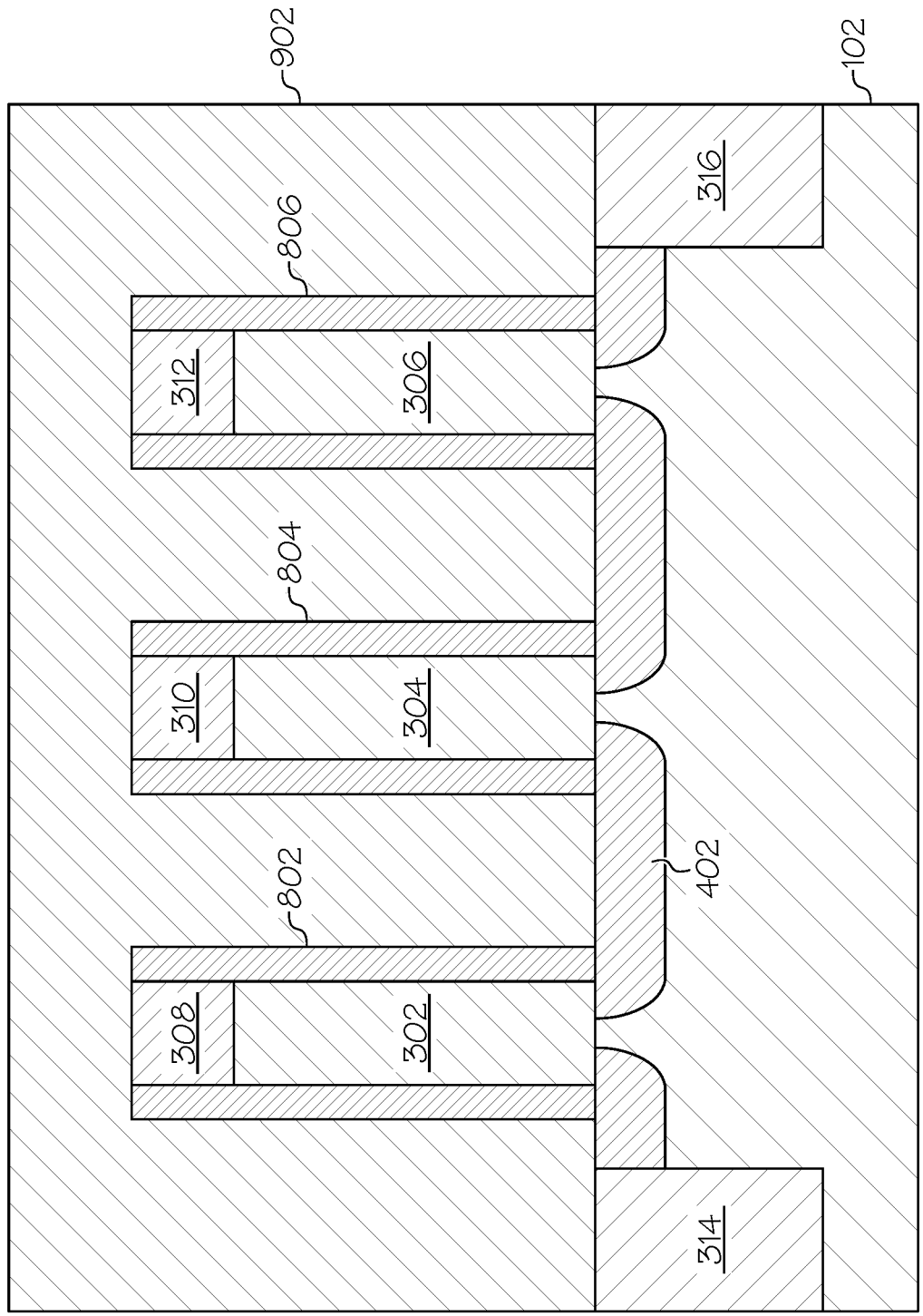
FIG. 9 is a cross-sectional view of the semiconductor structure after a second polymer brush layer has been formed according to one embodiment of the present disclosure.

FIG. 9 shows that after the cross-linking process(es) of the spacer brushes 802, 804, 806 has been performed a second polymer brush is coated onto the structure to form a second polymer brush layer 902. In one embodiment, the second polymer brush 902 comprises polydimethylsiloxane (PDMS), for example, with a selective grafting group such as a carboxyl group (—COOH). In other embodiments, the brush may be composed of polymeric organic siloxanes or polymers having carbon and silicon with a minimum silicon content of approximately 17%. Appropriate reactive groups include but are not limited to hydroxyl, amino, silane, thiol, etc.

The second polymer brush layer 902 is formed in contact with a top surface of the bottom source/drain layer 402; a top surface of each fin 302, 304, 306 (or hardmasks 308, 310, 312 if remaining); a top surface and sidewalls of the spacer brushes 802, 804, 806; and a top surface of the isolation regions 314, 316. The polymer brush may be applied to the substrate by spin coating, or other suitable techniques including but not limited to coating, spraying, dip coating, etc. The coating process should allow complete coverage of the targeted surface and result in a film thickness greater than the target grafted thickness. A baking or anneal process is then performed to graft a portion of the second polymer brush layer 902 at the respective interfaces between the second polymer brush layer 902 and the non-spacer-brush areas such as the exposed top surfaces of the bottom source/drain layer 402; the exposed top surface of the fins 302, 304, 306 or hardmasks 308, 301, 312 if remaining); and the exposed top surfaces of the isolation regions 314, 316. The annealing process can be carried out in air, vacuum, or inert atmospheres at a temperature from about 28 C to about 350 C. The temperature depends on the molecular weight and chemistry of the polymer used. The composition of the cross-linked spacer brushes 802, 804, 806 is such that the second polymer brush layer 902 does not graft onto the cross-linked spacer brushes 802, 804, 806.

Figure 10:
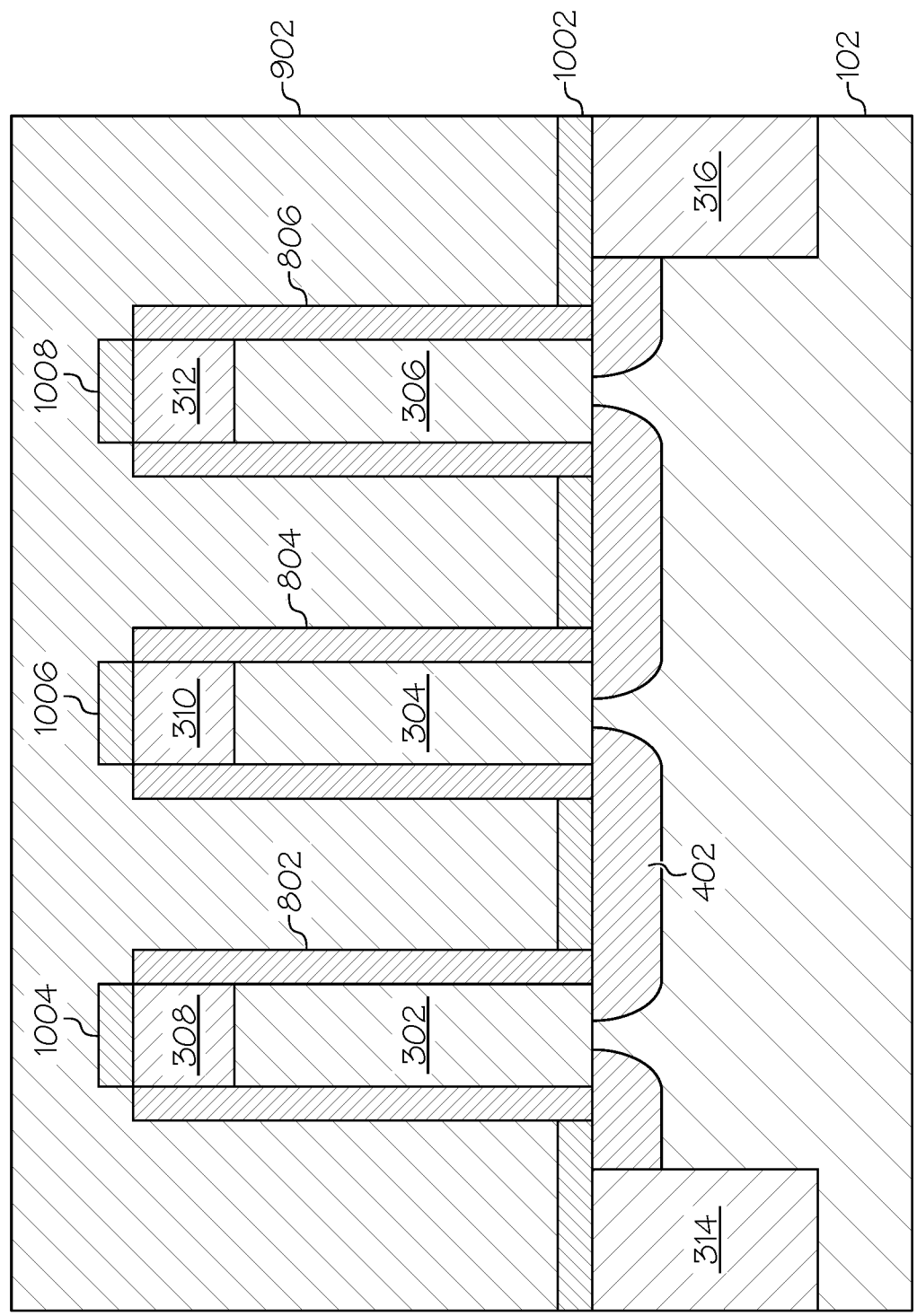
FIG. 10 is a cross-sectional view of the semiconductor structure after grafting process has been performed to form a monolayer from the second polymer brush layer according to one embodiment of the present disclosure.

The grafting process forms a plurality of second monolayers 1002 to 1008 from the second polymer brush 902 as shown in FIG. 10. In one embodiment, the monolayers 1002 to 1008 have a thickness of 5 to 30 nm. The thickness of the monolayers 1002 to 1008 is controlled by the molecular weight, chemistry and grafting density of the second polymer brush 902. In some embodiments, the brush layer includes PDMS having a molecular weight ranging from 5,000 to 100,000 g/mol.

Figure 11:
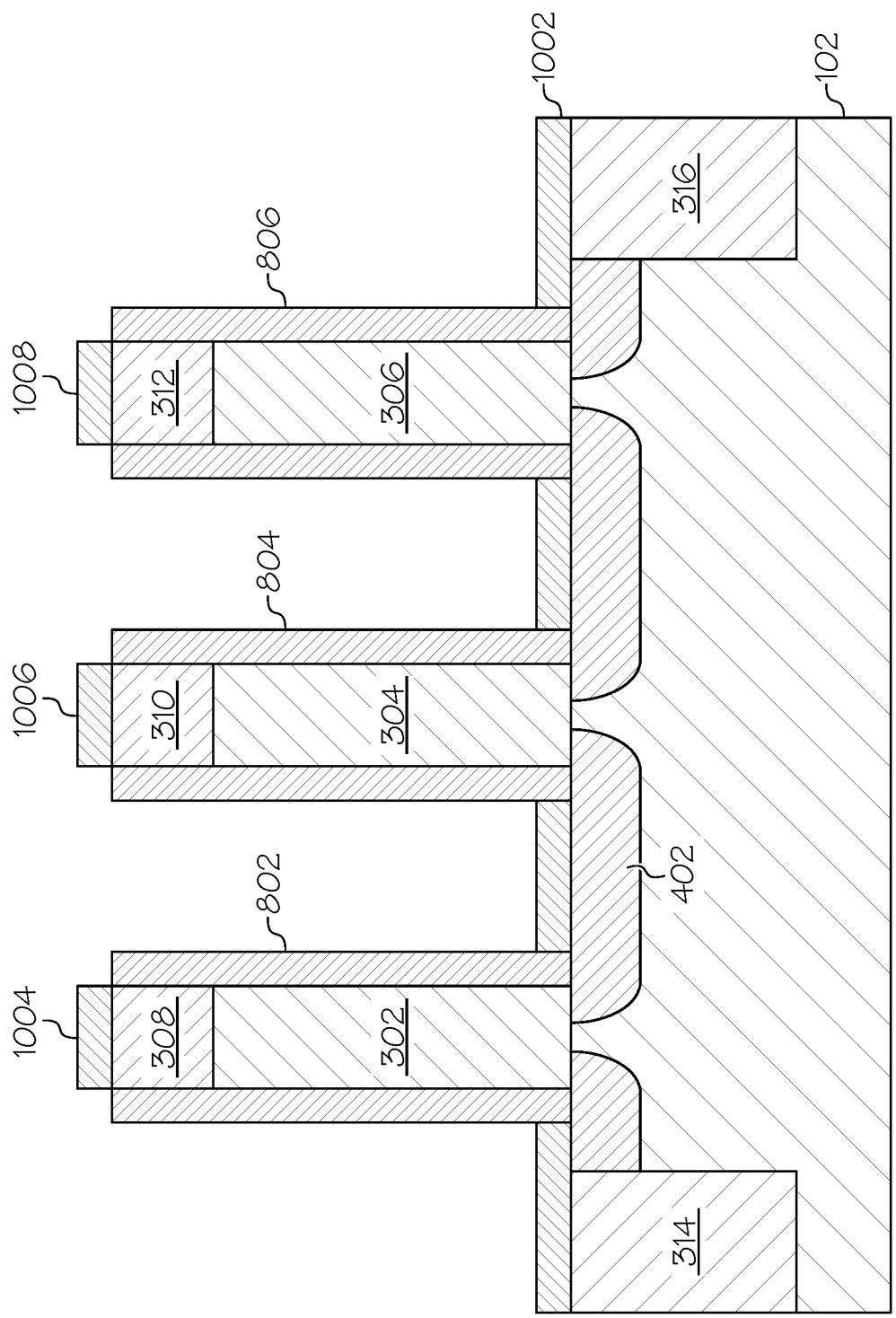
FIG. 11 is a cross-sectional view of the semiconductor structure after unreacted portions of the second polymer brush layer have been removed according to one embodiment of the present disclosure.

The unreacted portion of the second brush layer 902 is then given a solvent rinse to remove any excess polymer brush layer that was not grafted to a surface, as shown in FIG. 11. Examples of solvents for dissolving the second brush layer alone or in a composition with other components include (but are not limited to) propylene glycol monomethyl ether acetate (PGMEA), ethoxyethyl propionate, anisole, ethyl lactate, 2-heptanone, cyclohexanone, amyl acetate, n-butyl acetate, n-amyl ketone (MAK), gamma-butyrolactone (GBL), toluene, and the like. FIG. 10 shows only the second monolayer 902 of the brush material remains after the rinse.

Figure 12:
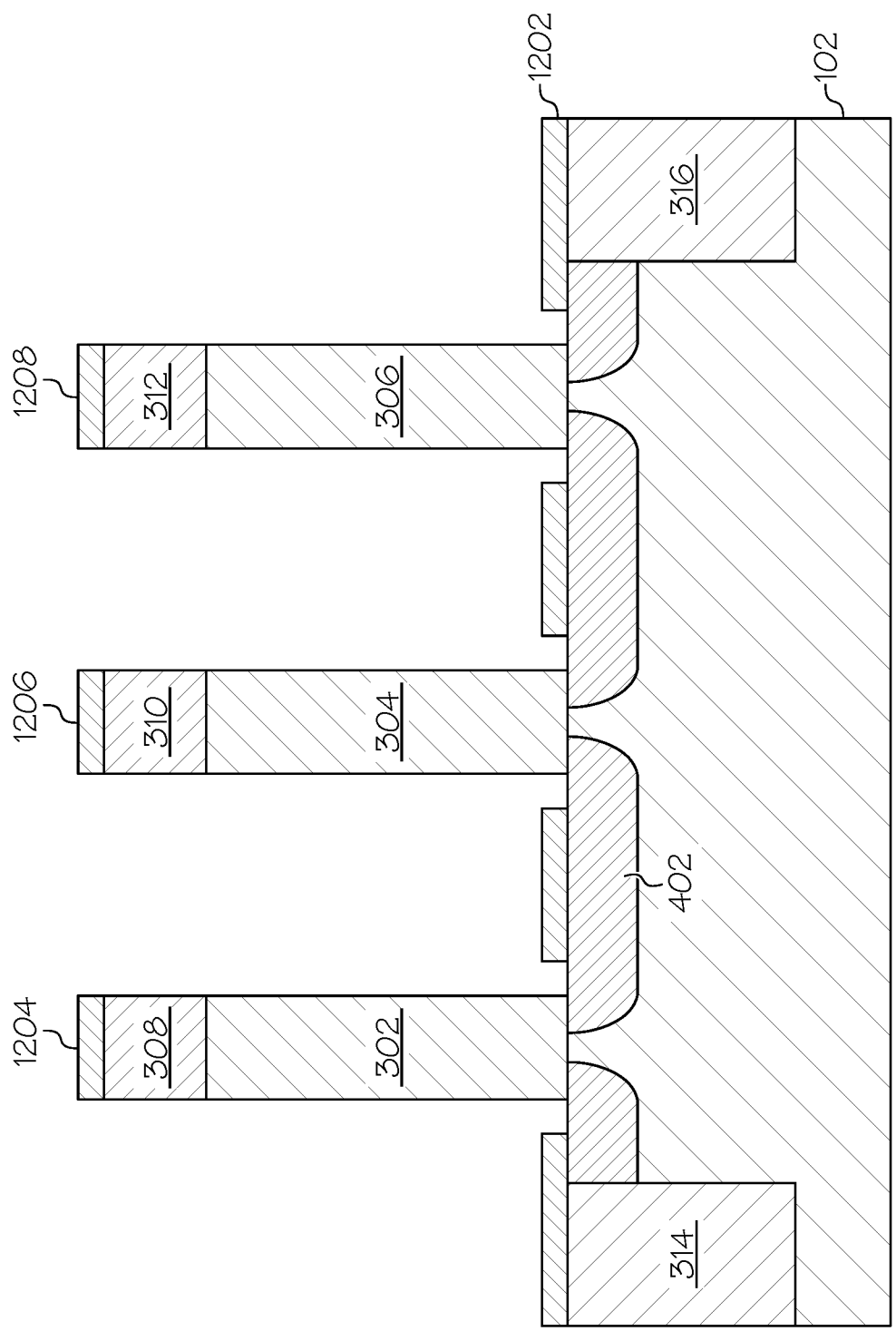
FIG. 12 is a cross-sectional view of the semiconductor structure after the polymer brush spacer has been removed and the monolayer formed from the second brush spacer has been converted to silicon dioxide according to one embodiment of the present disclosure.

An O2 (oxygen plasma) ashing process is then performed to remove organic material from the second monolayers 1002 to 1008 and to also remove the spacer brushes 802, 804, 806, as shown in FIG. 12. It should be noted that any etching process may be used, as long as it has a high removal rate for organic polymeric material and a very low or nonexistent rate for inorganic or SiOx-like materials. Oxygenated plasma ashing has a high "selectivity" for removal of organic materials relative to inorganic materials (e.g., SiOx particles). As part of the ashing process, the carbon-containing material in the second monolayers 1002 to 1008 is removed and the second monolayers are transformed/converted to a Si—O layer 1202 to 1208.

Figure 13:
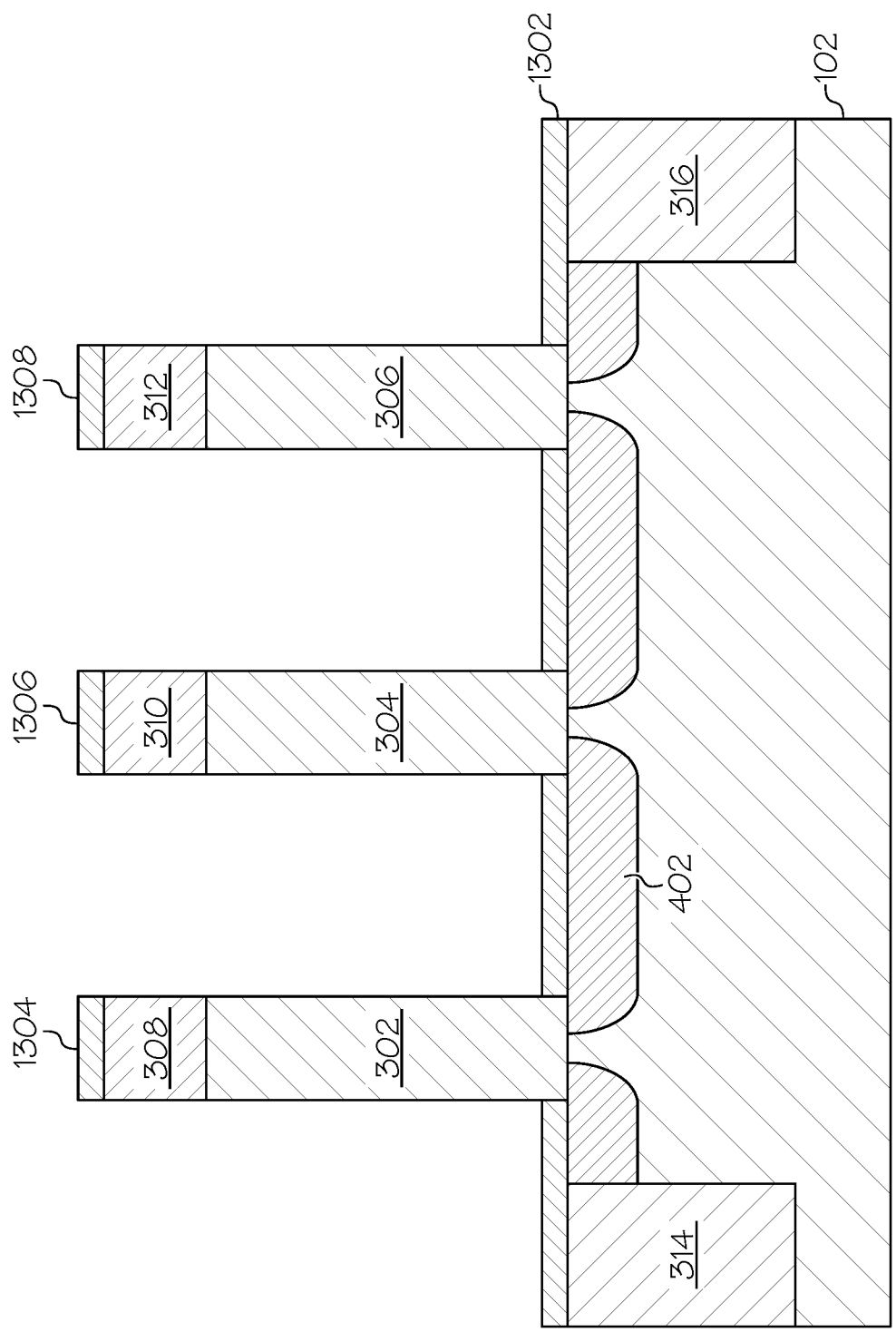
FIG. 13 is a cross-sectional view of the semiconductor structure after the silicon dioxide layer has been reflowed to form a bottom spacer layer according to one embodiment of the present disclosure.

After the spacer brushes 802, 804, 806 have been removed from the sidewalls of the fins 302, 304, 306 an underlying portion of the bottom source/drain layer 402 is exposed leaving a gap between the fins and the Si—O layer 1202. A reflow process is performed to flow the Si—O layer 1202 to the fins filling in the gap, as shown in FIG. 13. The reflow may be performed at ~500 C-700 C based on the thermal budget and throughput requirement. The amount of Si—O on top of the fins can be controlled with the coating thickness. (reduce the overburden during the coating). An optional anneal may then performed to condense the Si—O layers 1202 to 1208, depending on the requirement for final spacer quality, thermal budget and throughput. The anneal can also be done as part of the reflow, or rely on the immediate next step, i.e. the high-k deposition. If a separate condensation step is needed, a higher temperature, i.e. 700-1000 C RTA can be used.

The resulting layers 1202 are referred to as a "bottom spacer layer 1302" and "hardmasks 1304, 1306, 1308". The bottom spacer layer 1302 has a substantially uniform thickness with less than a 3 nm variation. It should be noted that the reflow and annealing operations may cause volume loss in the bottom spacer layer 1302. However, this may be compensated for by using a thicker second polymer brush. The final thickness of the bottom spacer layer 1302 is controlled by the material property (i.e., the molecular weight of the second polymer brush) and, therefore, is independent of pattern density, except the small volume change due to polymer spacer ashing and reflow.

Figure 14:
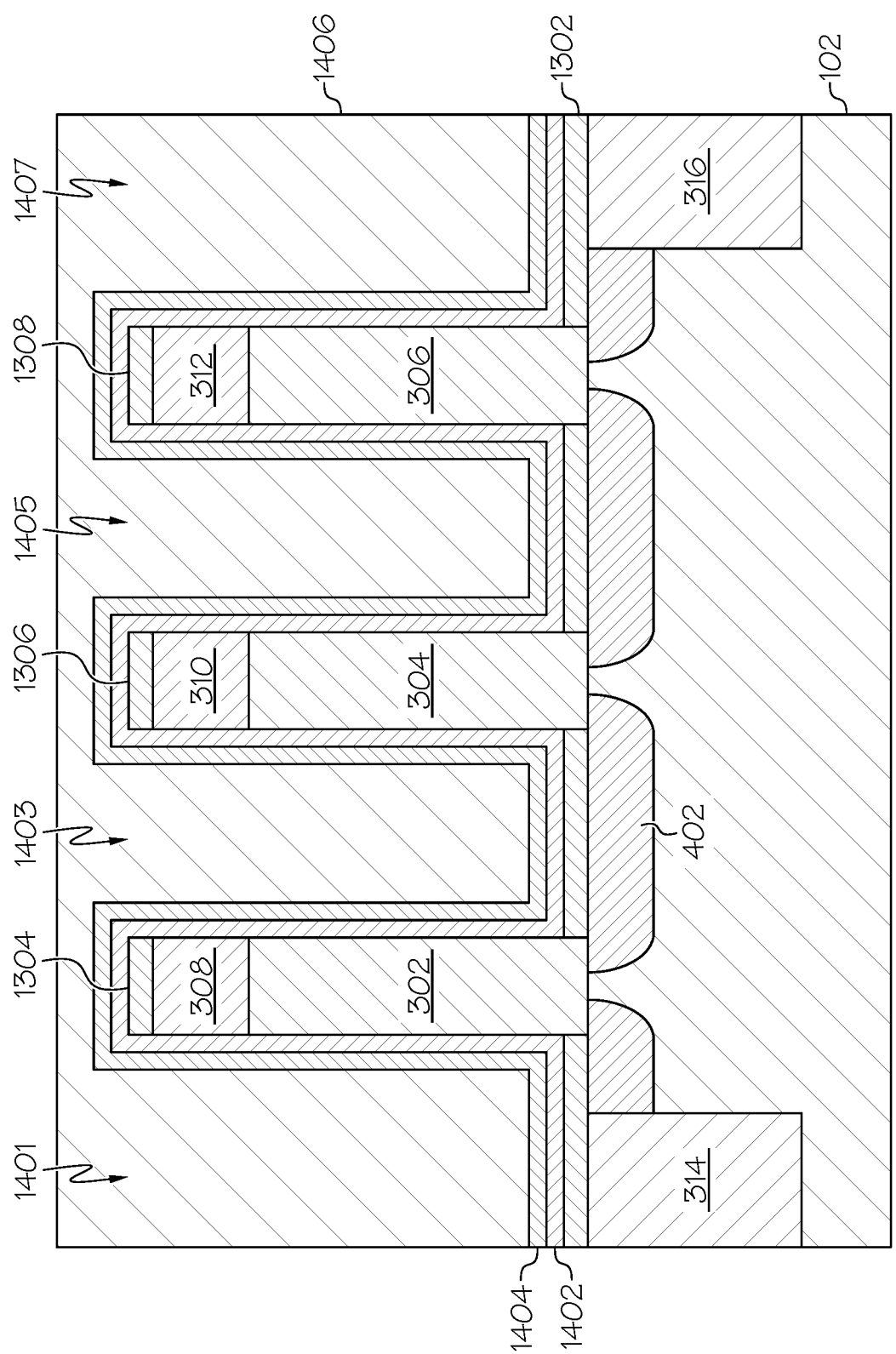
FIG. 14 is a cross-sectional view of the semiconductor structure after gate structure materials have been deposited according to one embodiment of the present disclosure.

After the bottom spacer layer 1302 has been formed, various fabrication processes are performed to complete the device as shown in FIGS. 14 to 18. It should be noted that embodiments of the present invention are not limited to the fabrication processes shown in FIGS. 14 to 18 and other processes are applicable as well. The processes shown in FIGS. 14-18 are just one example of fabrication processes applicable to embodiments of the invention. In FIG. 14, a high-k dielectric material is blanket deposited over the entire structure, for example by CVD (chemical vapor deposition), PECVD (plasma enhanced chemical vapor deposition), or ALD (Atomic layer deposition). The high-k gate material forms a high-k gate dielectric layer 1402. This layer 1402 is formed on, in contact with, and conforming to a top surface of the bottom spacer layer 1302; sidewalls of the fins 302, 304, 306; and a top surface of the fin hardmasks 308, 310, 312. In one embodiment, the high-k dielectric layer 1402 forms a "U" shape" within the gate regions 1401 to 1407. The high-k gate dielectric layer 1402 may have a thickness, for example, between 0.1 nm and 3 nm.

Examples of high-k materials include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k layer 1402 may further include dopants such as lanthanum or aluminum.

A conformal work function metal layer 1404 is then subsequently formed over, in contact with, and conforming to the high-k gate dielectric layer 1402 employing CVD, sputtering, or plating. The work function metal layer 1404 includes one or more metals having a function suitable to tune the work function of nFinFETs or pFinFETs. Exemplary metals that can be employed in the work function metal layer include, but are not limited to titanium, titanium nitride, titanium carbide, titanium aluminum nitride, rubidium, platinum, molybdenum, cobalt, and alloys and combinations. The thickness of the first work function metal layer can be from 3 nm to 15 nm, although lesser and greater thicknesses can also be employed.

A metal gate material 1406 is then deposited over the structure. In one embodiment, the metal gate material 1406 comprises polycrystalline or amorphous silicon, germanium, silicon germanium, a metal (e.g., tungsten, titanium, tantalum, ruthenium, zirconium, cobalt, copper, aluminum, lead, platinum, tin, silver, gold), a conducting metallic compound material (e.g., tantalum nitride, titanium nitride, tungsten silicide, tungsten nitride, ruthenium oxide, cobalt silicide, nickel silicide), carbon nanotube, conductive carbon, or any suitable combination of these materials. The conductive material may further comprise dopants that are incorporated during or after deposition.

Figure 15:
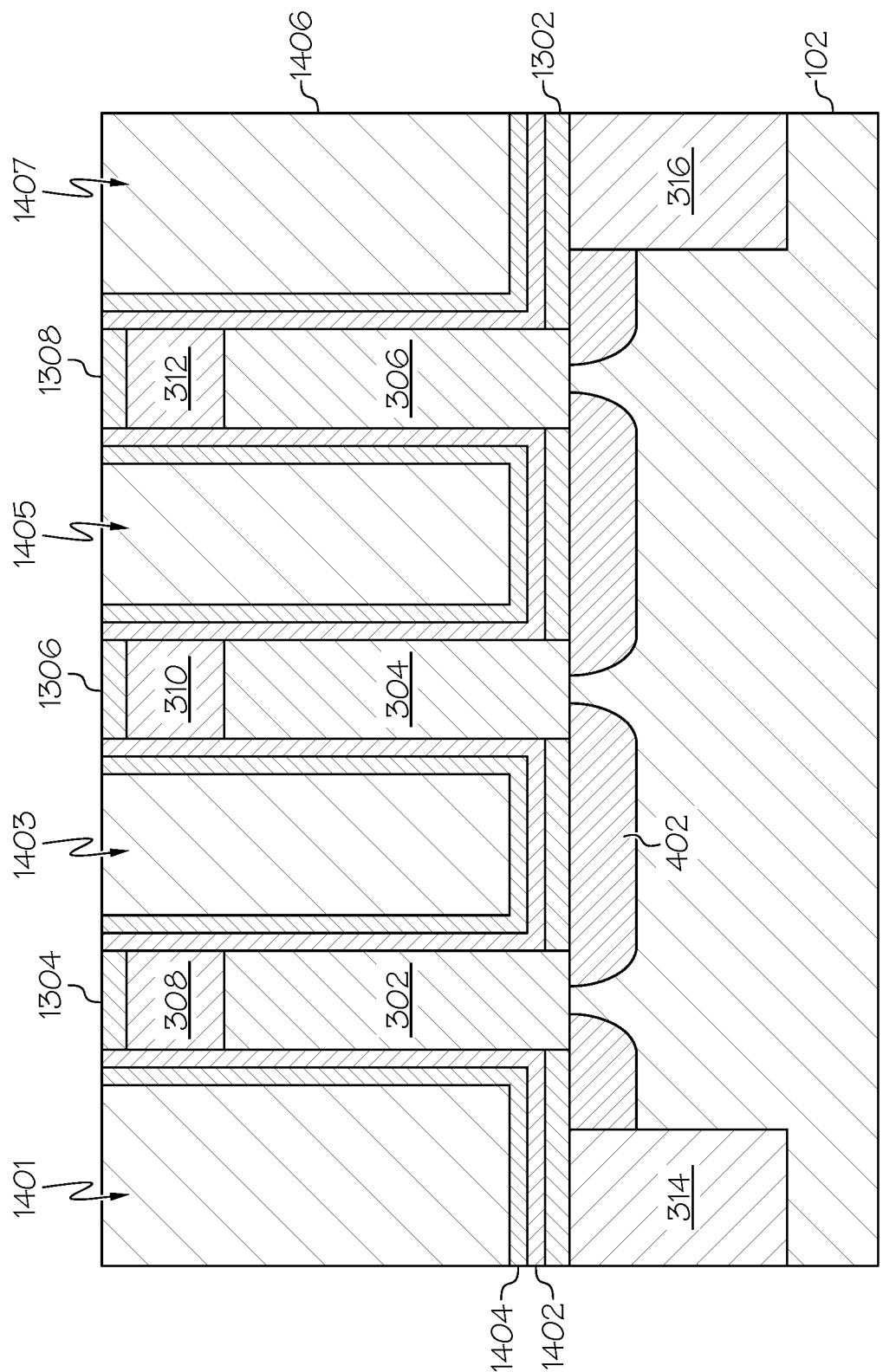
FIG. 15 is a cross-sectional view of the semiconductor structure after the gate structure materials have been planarized according to one embodiment of the present disclosure.

FIG. 14 shows that the metal gate material 1406 contacts the entire top surface of the work function metal layer 1404 and fills the gate regions 1401 to 1407. In one embodiment, the high-k gate dielectric layer 1402, the work function metal layer 1404, and the metal gate material 1406 are formed using, for example, deposition techniques including, but not limited to, CVD, PECVD, RFCVD, PVD, ALD, MLD, MBD, PLD, and/or LSMCD, sputtering, and/or plating. The high-k dielectric layer 1402, work function metal layer 1404, and metal gate material 1406 are then polished using, for example, CMP. This results in the high-k dielectric layer 1402, work function metal layer 1404, and metal gate material 1406 being co-planar with the top surface of the hardmasks 1304, 1306, 1308, as shown in FIG. 15.

Figure 16:
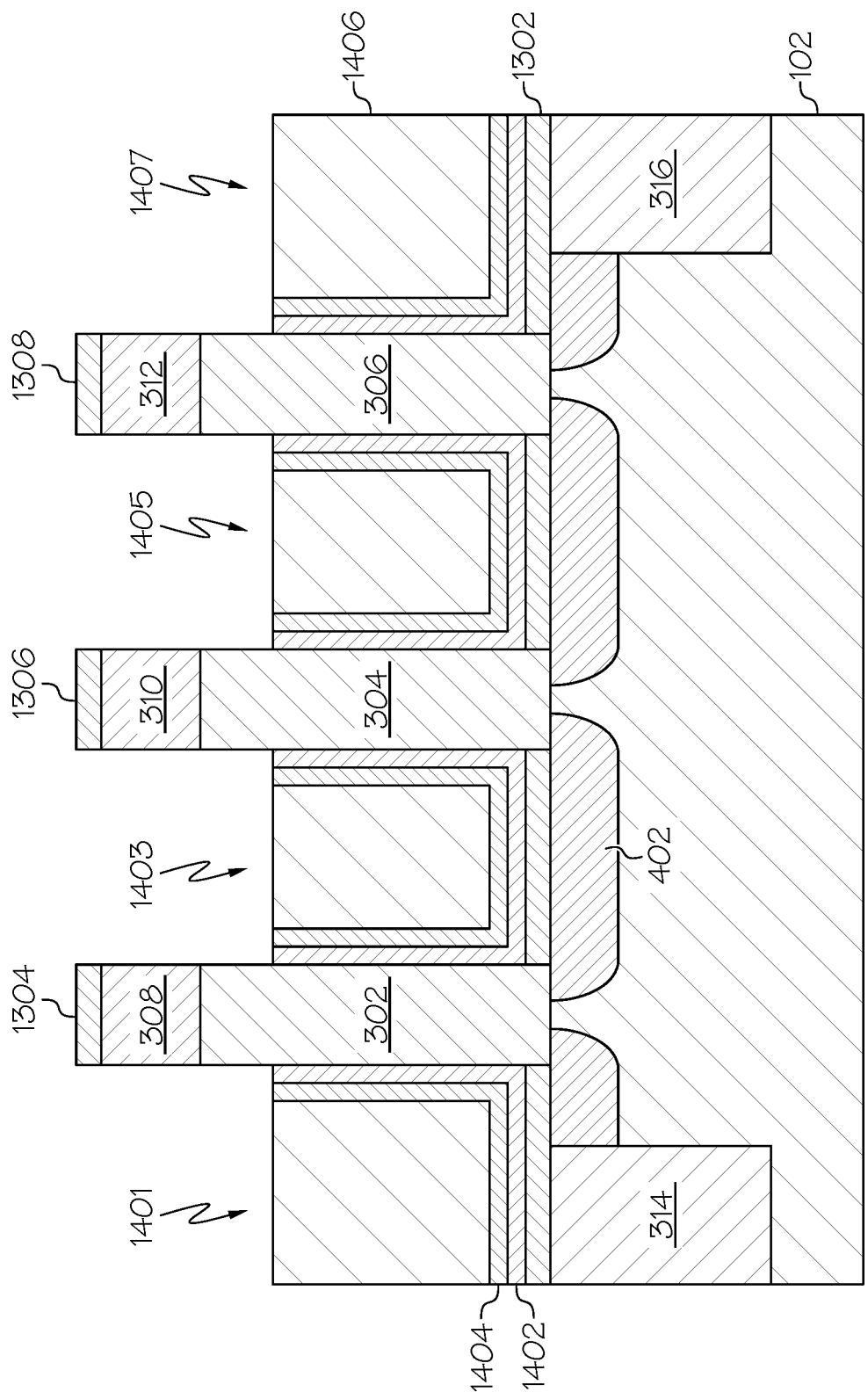
FIG. 16 is a cross-sectional view of the semiconductor structure after the gate structure materials have been recessed below a top portion of the fin structures according to one embodiment of the present disclosure.
Figure 17:
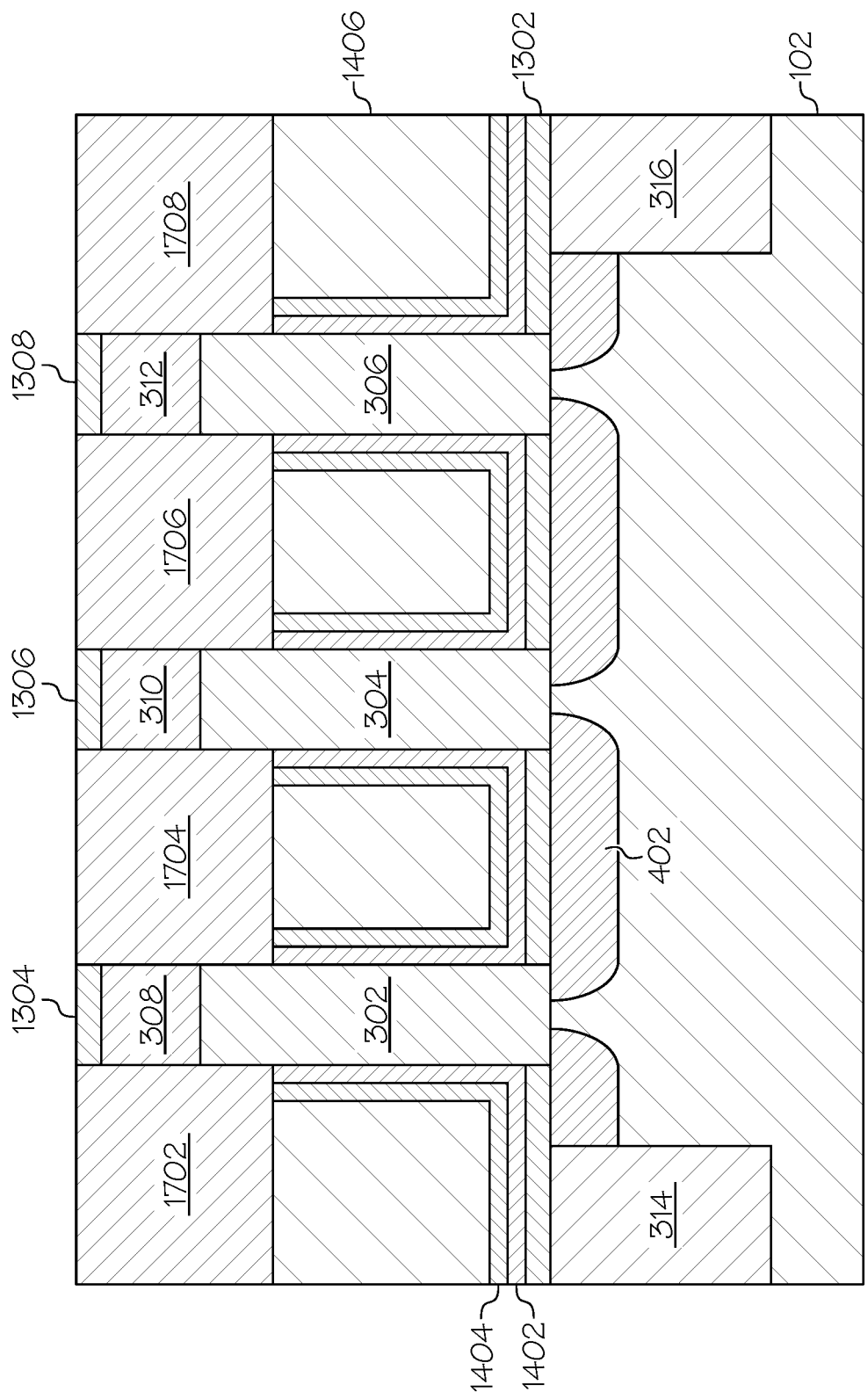
FIG. 17 is a cross-sectional view of the semiconductor structure after a top spacer layer has been formed according to one embodiment of the present disclosure.

FIG. 16 shows that the high-k dielectric layer 1402; work function metal layer 1404, and the metal gate materials 1406 are then recessed using one or more etching and/or polishing processes resulting in separate high-k dielectric layers 1402, work function metal layers 1404, metal gate material layers 1406 in each of the gate regions 1401 to 1407. In one embodiment, the recess depth is, for example, 20 nm to 100 nm. FIG. 17 shows that top spacers 1702 to 1708 are formed within each of gate regions 1401 to 1407. The top spacers 1702 to 1708 are formed in contact with the top surface of the high-k gate dielectric layers 1404; the top surface of the work function metal layers 1404; and the top surface of the metal gate material 1406. The top spacers 1702 to 1708 also contact a portion of the sidewalls of the fins 302, 304, 306 and fin hardmasks 308, 310, 312 and 1304, 1306, and 1308, and comprise a top surface that is co-planar with a top surface of fin hardmasks 1304, 1306, and 1308.

Once the top spacers 1702 to 1708 have been formed, the fin hardmasks 308, 310, 312 and 1304, 1306, and 1308 are then removed via selective etching or non-selective CMP leaving trenches that expose a top portion of the fins 302, 304, 306. An epitaxy process is then performed to grow a top source/drain layer 1802 from the fins 302, 304, 306 above and in contact with the top spacers 1702 to 1708. For example, epitaxy that is selective with respect to the materials of the top spacers 1702 to 1708 and fins 302, 304, 306 is used grow material to form the source/drain layer 1802. The source/drain layer 1802 comprises in-situ doping (boron, in one embodiment for pFET and phosphorus, in one embodiment, for nFET). It should be noted that, according to one embodiment, the source/drain layer 1802 may not contain any doping. In the present embodiment, the doping can be performed using any standard approach such as ion implantation. The top source/drain layer 1802 contacts the top surface of the top spacers 1702 to 1708, sidewalls of the top spacers 1702 to 1708, and a top surface of the fins 302, 304, 306. The source/drain layer 1802 may have a thickness in a range of, for example, about 10 nm to about 200 nm. However, other thicknesses are applicable as well. The source/drain layer 1802 may be formed using an epitaxy process. Additional fabrication processes may then be performed such as contact formation.

Figure 19:
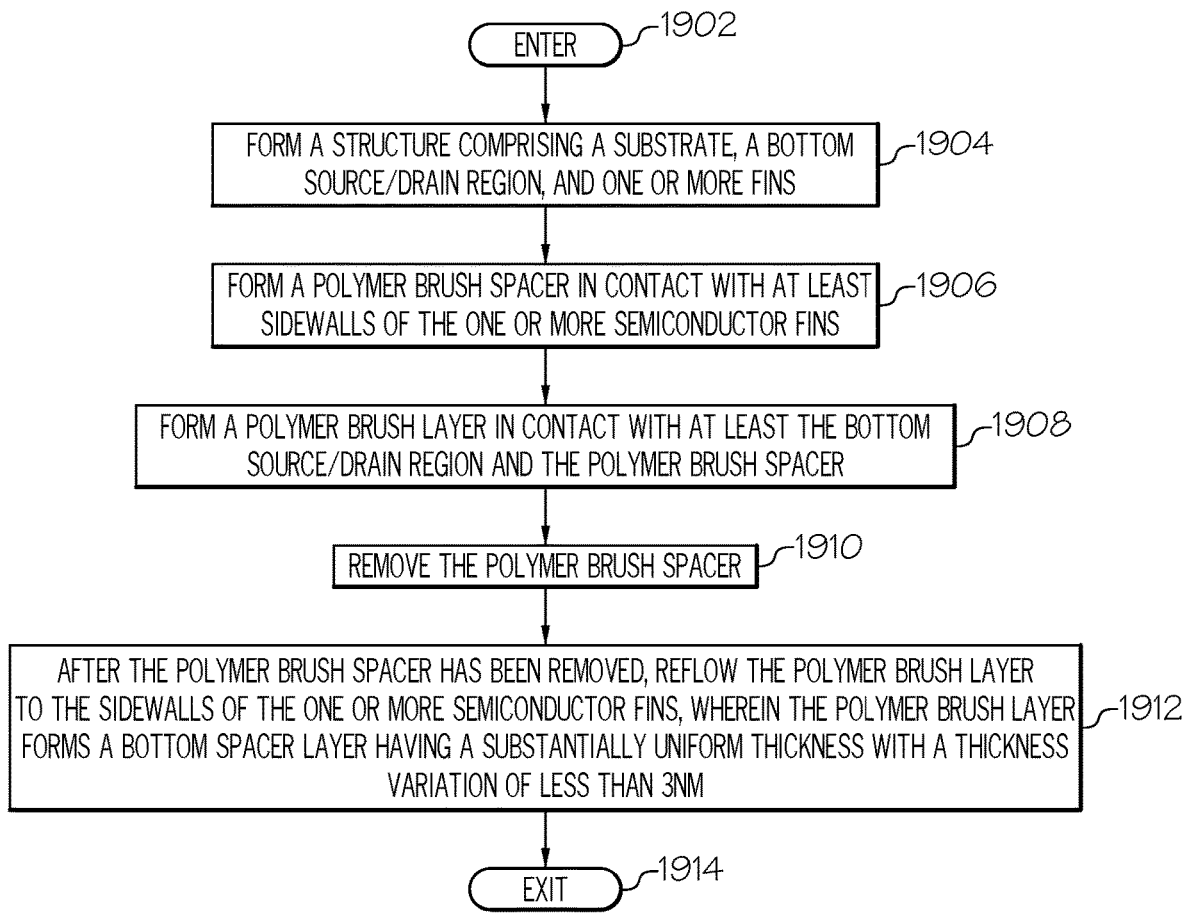
FIG. 19 is an operational flow diagram illustrating one process for forming a semiconductor structure comprising vertical field-effect-transistors a bottom spacer layer with a uniform thickness according to one embodiment of the present disclosure.

FIG. 19 is an operational flow diagram illustrating one process for forming a semiconductor structure comprising a plurality of vertical FETs having different voltage thresholds according to one embodiment of the present disclosure. In FIG. 19, the operational flow diagram begins at step 1902 and flows directly to step 1904. It should be noted that each of the steps shown in FIG. 19 has been discussed in greater detail above with respect to FIGS. 1-18.

A structure, at step 1904, is formed comprising at least a substrate, a source/drain region, and a bottom source/drain region, and one or more fins. A polymer brush spacer, at step 1906, is formed in contact with at least sidewalls of the one or more semiconductor fins. A polymer brush layer, at step 1908, is formed in contact with at least the bottom source/drain region and the polymer brush spacer. The polymer brush spacer, at step 1910, is removed. After the polymer brush spacer has been removed, the polymer brush layer, at step 1912, is reflowed to the sidewalls of the one or more semiconductor fins to form a bottom spacer layer having a substantially uniform thickness uniform thickness with a thickness variation of less than 3 nm. The control flow then exits at step 1914.

Although specific embodiments of the disclosure have been disclosed, those having ordinary skill in the art will understand that changes can be made to the specific embodiments without departing from the spirit and scope of the disclosure. The scope of the disclosure is not to be restricted, therefore, to the specific embodiments, and it is intended that the appended claims cover any and all such applications, modifications, and embodiments within the scope of the present disclosure.

It should be noted that some features of the present disclosure may be used in one embodiment thereof without use of other features of the present disclosure. As such, the foregoing description should be considered as merely illustrative of the principles, teachings, examples, and exemplary embodiments of the present disclosure, and not a limitation thereof.

Also, these embodiments are only examples of the many advantageous uses of the innovative teachings herein. In general, statements made in the specification of the present application do not necessarily limit any of the various claimed disclosures. Moreover, some statements may apply to some inventive features but not to others.

What is claimed is:

1. A vertical field-effect transistor comprising at least:
   a substrate;
   a bottom source/drain region;
   at least one fin structure formed in contact with the bottom source/drain region;
   a bottom spacer layer having a substantially uniform thickness with a thickness variation of less than 3 nm, wherein the bottom spacer layer contacts a sidewall of the at least one fin structure;
   a gate structure in contact with the bottom spacer layer and the at least one fin structure; and
   a top spacer layer formed in contact with the gate structure and the at least one fin structure.

2. The vertical field-effect transistor of claim 1, further comprising:
   a top source/drain region in contact with the top spacer layer and the at least one fin structure.

3. The vertical field-effect transistor of claim 2, wherein the top source/drain region comprises a top surface above a top surface of the top spacer layer, and wherein a portion of the top source/drain region extends below the top surface of the top spacer layer.

4. The vertical field-effect transistor of claim 1, wherein the bottom spacer layer comprises silicon dioxide.

5. The vertical field-effect transistor of claim 1, wherein the gate structure comprises:
   a high-k dielectric layer;
   a work function layer; and
   a metal gate layer.

6. The vertical field-effect transistor of claim 5, wherein the high-k dielectric layer is formed in contact with the bottom spacer layer and the at least one fin structure.

7. The vertical field-effect transistor of claim 5, wherein the work function layer is formed in contact with and conforming to the high-k dielectric layer, and the metal gate layer is formed in contact with the work function metal layer.

8. The vertical field-effect transistor of claim 1, wherein the bottom source/drain region is formed within the substrate.

9. The vertical field-effect transistor of claim 1, wherein the bottom spacer layer contacts the bottom source/drain region.

10. An integrated circuit comprising:
    at least one vertical field-effect transistor, the vertical field-effect transistor comprising at least:
    a substrate;
    a bottom source/drain region;
    at least one fin structure formed in contact with the bottom source/drain region;
    a bottom spacer layer having a substantially uniform thickness with a thickness variation of less than 3 nm, wherein the bottom spacer layer contacts a sidewall of the at least one fin structure;
    a gate structure in contact with the bottom spacer layer and the at least one fin structure; and a top spacer layer formed in contact with the gate structure and the at least one fin structure.

11. The integrated circuit of claim 10, wherein the at least one vertical field-effect transistor further comprises:
a top source/drain region in contact with the top spacer layer and the at least one fin structure.

12. The integrated circuit of claim 11, wherein the top source/drain region comprises a top surface above a top surface of the top spacer layer, and wherein a portion of the top source/drain region extends below the top surface of the top spacer layer.

13. The integrated circuit of claim 10, wherein the bottom spacer layer comprises silicon dioxide.

14. The integrated circuit of claim 10, wherein the gate structure comprises:
a high-k dielectric layer;
a work function layer; and
a metal gate layer.

15. The integrated circuit of claim 14, wherein the high-k dielectric layer is formed in contact with the bottom spacer layer and the at least one fin structure.

16. The integrated circuit of claim 14, wherein the work function layer is formed in contact with and conforming to the high-k dielectric layer, and the metal gate layer is formed in contact with the work function metal layer.

17. The integrated circuit of claim 10, wherein the bottom source/drain region is formed within the substrate.

18. The integrated circuit of claim 10, wherein the bottom spacer layer contacts the bottom source/drain region.

19. A vertical field-effect transistor comprising at least:
a substrate;
a bottom source/drain region;
at least one fin structure formed in contact with the bottom source/drain region;
a polymer brush based bottom spacer layer having a substantially uniform thickness with a thickness variation of less than 3 nm, wherein the thickness of the polymer brush based bottom spacer layer is related to a molecular weight of a polymer brush from which the polymer brush based bottom spacer layer was formed, and wherein the polymer brush based bottom spacer layer contacts a sidewall of the at least one fin structure; and
a gate structure in contact with the polymer brush based bottom spacer layer and the at least one fin structure.

* * * * *